(12) United States Patent
Heima

(10) Patent No.: US 9,871,493 B2
(45) Date of Patent: Jan. 16, 2018

(54) MULTISTAGE AMPLIFIER

(71) Applicant: Mitsubishi Electric Corporation, Tokyo (JP)

(72) Inventor: Tetsuya Heima, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 15/048,340

(22) Filed: Feb. 19, 2016

(65) Prior Publication Data

US 2016/0352288 A1 Dec. 1, 2016

(30) Foreign Application Priority Data

May 28, 2015 (JP) ................. 2015-109040

(51) Int. Cl.
| | | |
|---|---|---|
| *H03F 1/30* | (2006.01) | |
| *H03F 3/21* | (2006.01) | |
| *H03F 1/02* | (2006.01) | |
| *H03F 3/193* | (2006.01) | |
| *H03F 3/45* | (2006.01) | |

(52) U.S. Cl.
CPC ........... *H03F 3/211* (2013.01); *H03F 1/0205* (2013.01); *H03F 3/193* (2013.01); *H03F 3/45183* (2013.01); *H03F 3/45475* (2013.01); *H03F 3/45479* (2013.01); *H03F 1/30* (2013.01); *H03F 1/301* (2013.01); *H03F 1/302* (2013.01); *H03F 2200/408* (2013.01); *H03F 2200/447* (2013.01); *H03F 2200/468* (2013.01); *H03F 2200/555* (2013.01)

(58) Field of Classification Search
CPC ........ H03F 1/301; H03F 1/0205; H03F 3/211; H03F 2200/468; H03F 2200/555; H03F 3/45183; H03F 3/45475; H03F 3/45479; H03F 3/193; H03F 2200/447; H03F 2200/408; H03F 1/30
USPC ................. 330/98, 133, 150, 289, 310
See application file for complete search history.

(56) References Cited

U.S. PATENT DOCUMENTS 4,423,388 A * 12/1983 Crescenzi, Jr. ......... H03F 3/601
330/310
4,559,503 A * 12/1985 Camand .................... H03F 3/19
330/310

(Continued)

FOREIGN PATENT DOCUMENTS

| JP | 2002/529949 A | 9/2002 |
|---|---|---|
| JP | 2003-243938 A | 8/2003 |

(Continued)

*Primary Examiner* — Khanh V Nguyen
(74) *Attorney, Agent, or Firm* — Studebaker & Brackett PC

(57) ABSTRACT

A first transistor has a first terminal and a second terminal. A second transistor has a third terminal, a fourth terminal and a fifth terminal electrically connected to the second terminal of the first transistor during amplification performed by the first transistor. A first bias circuit is electrically connected to the first terminal of the first transistor and supplies a first bias to the first terminal so that a magnitude of the first bias is increased with a rise in circuit temperature. A second bias circuit is electrically connected to the third terminal of the second transistor and supplies a second bias to the third terminal so that the magnitude of the second bias is constantly maintained with respect to changes in the circuit temperature.

11 Claims, 20 Drawing Sheets

(56) References Cited

U.S. PATENT DOCUMENTS

| | | | | | |
|---|---|---|---|---|---|
| 5,057,788 | A | * | 10/1991 | Ushida | H03F 3/45085 |
| | | | | | 330/310 |
| 5,389,891 | A | * | 2/1995 | Philippe | H03F 1/0283 |
| | | | | | 330/310 |
| 6,020,848 | A | * | 2/2000 | Wallace | H01Q 3/30 |
| | | | | | 330/310 |
| 8,264,279 | B2 | * | 9/2012 | Anegawa | H03F 3/601 |
| | | | | | 330/310 |
| 8,508,302 | B2 | * | 8/2013 | Fujita | H03K 19/0019 |
| | | | | | 330/310 |
| 8,797,101 | B2 | * | 8/2014 | Imagawa | H03F 1/223 |
| | | | | | 330/310 |
| 2003/0155980 | A1 | | 8/2003 | Heima | |
| 2003/0214358 | A1 | | 11/2003 | Yamamoto | |

FOREIGN PATENT DOCUMENTS

| | | |
|---|---|---|
| JP | 2003-332864 A | 11/2003 |
| WO | 00/27026 A2 | 5/2000 |

\* cited by examiner

MULTISTAGE AMPLIFIER

BACKGROUND OF THE INVENTION

Field of the Invention

The present invention relates to a multistage amplifier.

Background Art

A technique called current reuse, i.e., a technique of vertically stacking a plurality of circuits so that a current flowing in an upper-stage circuit is reused in a lower-stage circuit, is being put to practical use. Typically, with the reduction in power supply voltages to CMOS circuits, a related technique has been provided in which a high-withstand-voltage power supply voltage is used by vertically stacking a plurality of CMOS circuits. Typical examples of circuits vertically stacked for current reuse in the related art are memory devices, digital (logic) circuits and RF circuits (e.g., LNA+Buffer or VCO+MIX). A consumption current can be reduced by performing current reuse.

A technique of performing current reuse in a multistage amplifier, for example, as disclosed in Japanese Patent Laid-Open No. 2003-332864 is known. In this multistage amplifier, a drain of an initial stage amplifier (initial stage amplifying transistor) and a gate of a final stage amplifier (final stage amplifying transistor) are connected to each other to perform multistage amplification of an input signal. Further, from the viewpoint of current reuse, a source of the final stage amplifying transistor and the drain of initial stage amplifying transistor are connected to each other.

A bias circuit is connected to each of a plurality of circuits vertically stacked for current reuse. In many cases, if a circuit which receives a bias has a temperature characteristic, a bias circuit adjusts the magnitude of the bias in order to avoid degradation of the circuit characteristic with changes in temperature. In a case where a plurality of circuits vertically stacked respectively have temperature characteristics, bias circuits adjust the magnitudes of current biases to the circuits in upper and lower stages so that the circuit characteristics do not degrade with changes in temperature. In a memory device or the like, circuits in an upper stage and circuits in a lower stage in circuits vertically stacked are operated with temperature characteristics equal to each other. Accordingly, in a memory device or the like, a plurality of bias circuits change biases to circuit in an upper stage and circuit in a lower stage with the same tendency with respect to the change of temperature.

On the other hand, in a multistage amplifier, biases may be supplied in a way different from that described above. In a multistage amplifier, a signal amplified by an initial stage amplifier is input to an amplifier in a subsequent stage. Therefore, the magnitude of the input signal is changed between the initial stage amplifier and the subsequent stage amplifier. Due to this difference, different performance capabilities are required of the initial stage amplifier and the subsequent stage amplifier. In order to meet different performance requirements, it is desirable to give certain temperature characteristic to one particular performance capability that the initial stage amplifier has and to give a different temperature characteristic to another particular performance capability that the subsequent stage amplifier has. This is a specific condition irrelevant to the above-described memory device or the like. The above-described related technique lacks consideration of this difference, and there are still improvement points for multistage amplifiers using current reuse.

SUMMARY OF THE INVENTION

In view of the above-described problem, an object of the present invention is to provide a multistage amplifier having a reduced power consumption and good characteristics.

According to the present invention, a multistage amplifier includes: a first transistor having a first terminal to which an input signal is input and a second terminal from which a signal obtained by amplifying the input signal is output; a second transistor having a third terminal to which the signal amplified by the first transistor is input, a fourth terminal from which a signal obtained by amplifying the signal received by the third terminal is output and a fifth terminal electrically connected to the second terminal of the first transistor during amplification performed by the first transistor; a first bias circuit electrically connected to the first terminal of the first transistor and supplying a first bias to the first terminal so that a magnitude of the first bias is increased with a rise in circuit temperature; and a second bias circuit electrically connected to the third terminal of the second transistor and supplying a second bias to the third terminal so that the magnitude of the second bias is constantly maintained with respect to changes in the circuit temperature.

According to the present invention, a multistage amplifier having a reduced power consumption and good characteristics can be obtained by making a combination of current reuse techniques for multistage amplifiers and by adjusting biases so as to compensate for a reduction in gain due to a rise in temperature.

DETAILED DESCRIPTION OF THE PREFERRED EMBODIMENTS

First Embodiment

[Configuration of Apparatus According to a First Embodiment]

Figure 1:
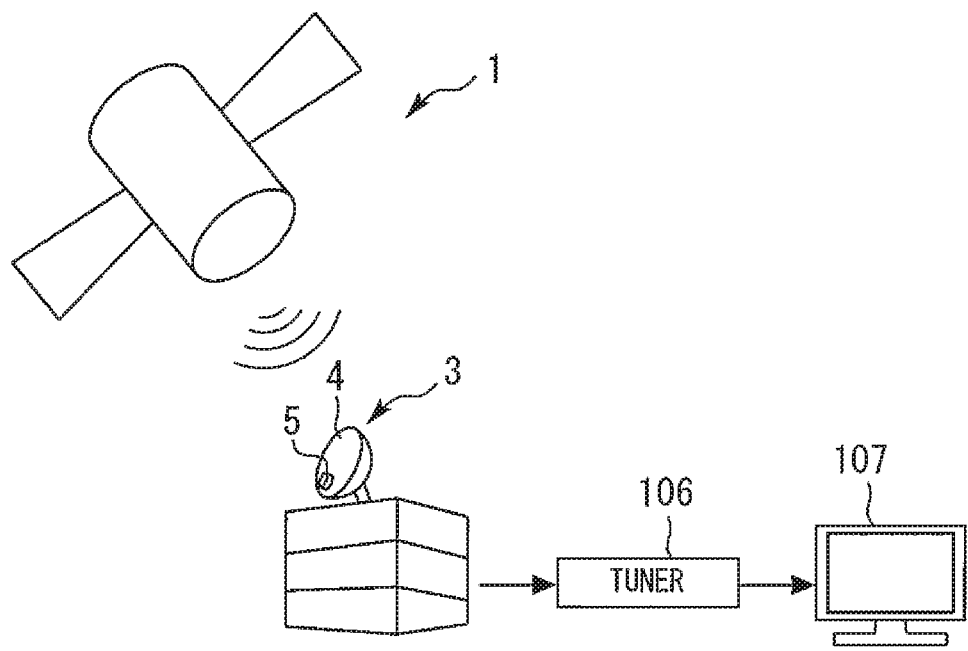
FIG. 1 is a diagram showing a communication system including a multistage amplifier according to a first embodiment of the present invention.
Figure 2:
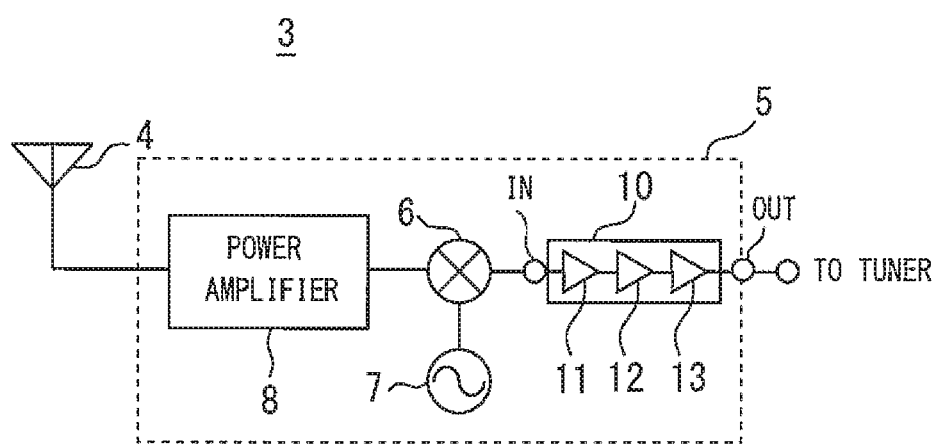
FIG. 2 is a block diagram showing the converter including the multistage amplifier.

FIG. 1 is a diagram showing a communication system including a multistage amplifier 10 according to a first embodiment of the present invention. The communication system shown in FIG. 1 has a receiver 3, a tuner 106 which receives a signal from the receiver 3, and a television set 107 which produces, from a video signal and an audio signal from the tuner 106, a display on a screen and an output through a speaker. The receiver 3 has a BS antenna 4 and a converter 5 attached to the BS antenna 4. A signal from a broadcasting satellite 1 is received with the BS antenna 4 installed outdoors and displayed on the television set 107 via the converter 5 and the tuner 106. The multistage amplifier 10 is incorporated in the converter 5. The converter 5 installed outdoors can be easily influenced by atmospheric temperature and the BS antenna 4 may be placed in a severe high-temperature or low-temperature environment. FIG. 2 is a block diagram showing the converter 5 including the multistage amplifier 10. The converter 5 includes a power amplifier 8, an oscillator 7, a mixer 6 and the multistage amplifier 10. The mixer 6 outputs to the multistage amplifier 10 a signal formed by mixing an output signal from the power amplifier 8 and a signal from the oscillator 7. While an example of application of the multistage amplifier 10 to the BS receiving system is described in the description of the first embodiment, the multistage amplifier 10 may also be applied to a CS receiving system. Needless to say, a transmitting system can also be constructed by incorporating the multistage amplifier 10 in a transmitter.

Figure 3:
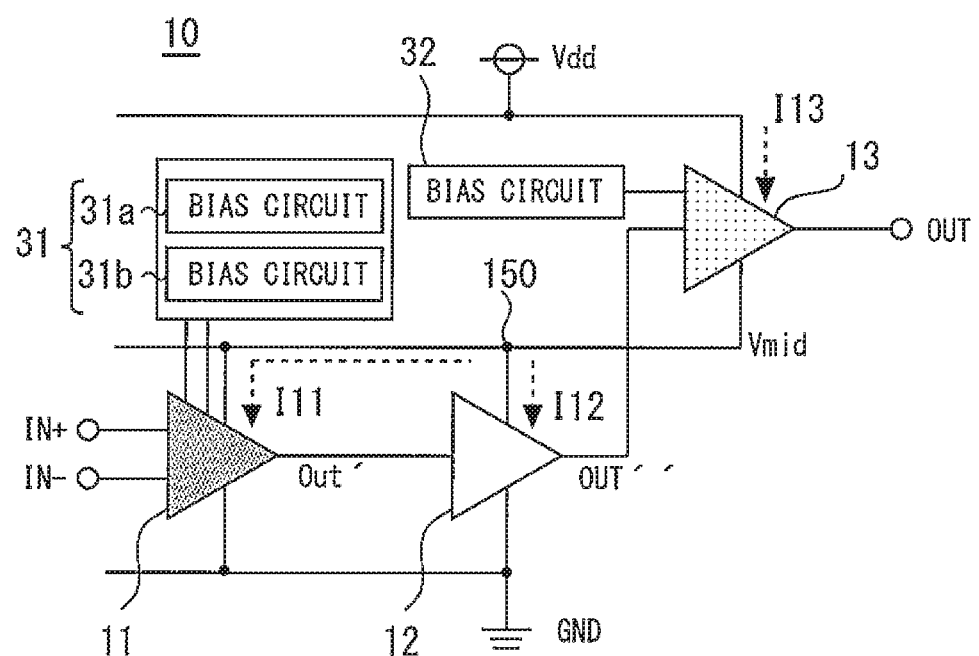
FIG. 3 is a circuit diagram of the multistage amplifier according to the first embodiment of the present invention.

FIG. 3 is a circuit diagram of the multistage amplifier 10 according to the first embodiment of the present invention. The multistage amplifier 10 has an initial stage amplifier 11, a second stage amplifier 12, a final stage amplifier 13, a bias circuit 31 for supplying a current bias to the initial stage amplifier 11 and a bias circuit 32 for supplying a current bias to the final stage amplifier 13 and is capable of performing three-stage amplification. The initial stage and second stage amplifiers 11 and 12 and the final stage amplifier 13 are vertically stacked in two stages to perform current reuse. The initial stage amplifier 11 and the second stage amplifier 12 are connected to a GND node and to an intermediate node 150, while the final stage amplifier 13 is connected to the intermediate node 150 and to a power supply node Vdd. In the vertical stack relationship, the initial stage amplifier 11 and the second stage amplifier 12 are positioned in the "lower stage" and the final stage amplifier 13 is positioned in the "upper stage".

In a preferred mode of the first embodiment, an "adjustment circuit" for adjusting the magnitude of a current flowing through the intermediate node 150 so that variation in potential on the intermediate node 150 is limited is provided. In the first embodiment, the second stage amplifier 12 plays a role as this adjustment circuit.

Figure 4:
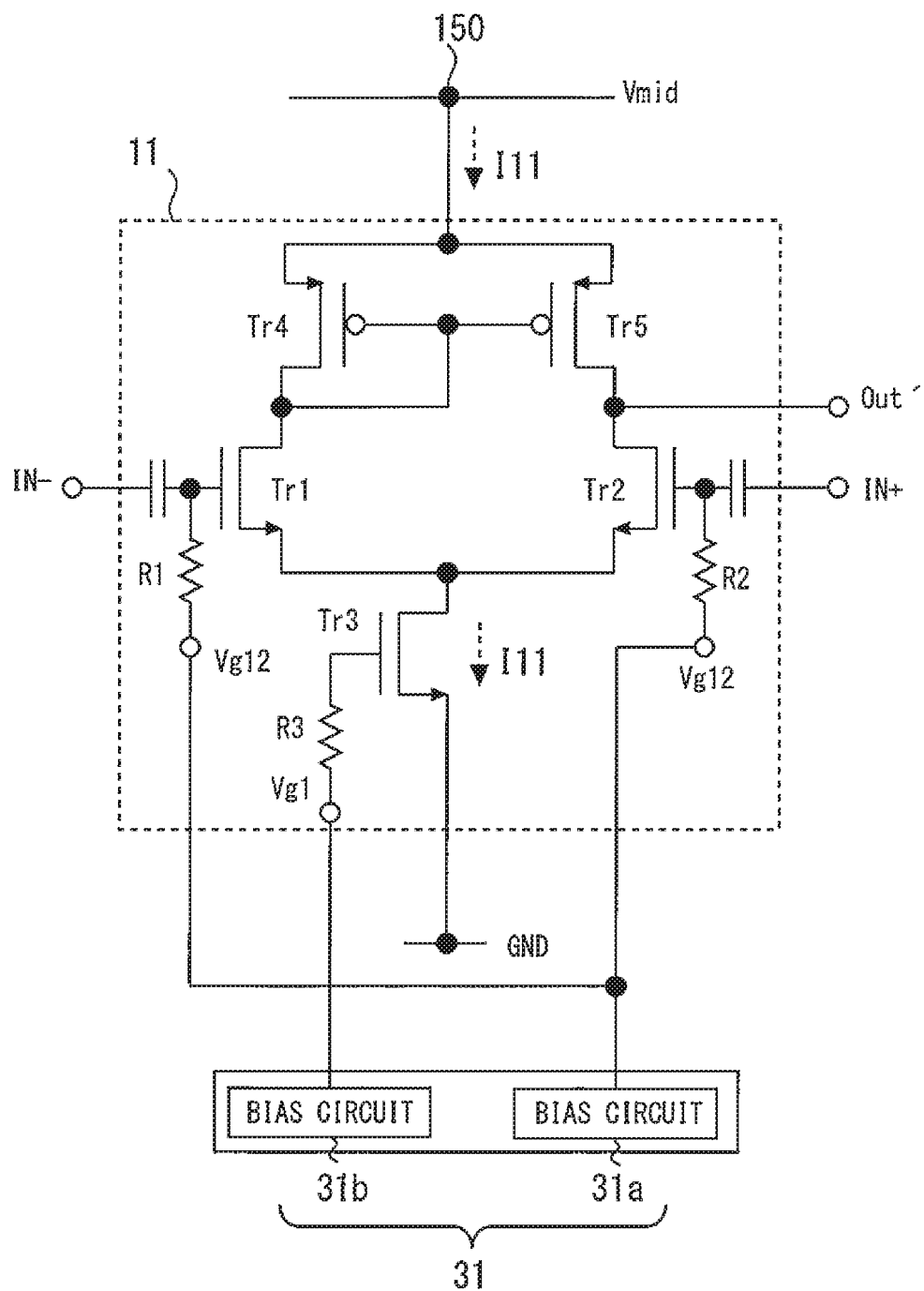
FIG. 4 is a circuit diagram of the initial stage amplifier that the multistage amplifier according to the first embodiment of the present invention has.

FIG. 4 is a circuit diagram of the initial stage amplifier 11 that the multistage amplifier 10 according to the first embodiment of the present invention has. FIG. 4 also shows the bias circuit 31 for supplying a bias to the initial stage amplifier 11 as well as the initial stage amplifier 11. Any of various well-known differential amplifier circuits may preferably be used as initial stage amplifier 11. The differential amplifier circuit shown in FIG. 4 by way of example has initial stage amplifying transistors Tr1 and Tr2 having their sources connected to each other and having input signals IN+ and IN− input to their gates, an initial stage amplifying transistor Tr3 provided between a source connection point of the initial stage amplifying transistors Tr1 and Tr2 and a GND node, and transistors Tr4 and Tr5 provided between drains of the initial stage amplifying transistors Tr1 and Tr2 and the intermediate node 150.

In this embodiment, the initial stage amplifying transistor Tr2 corresponds to the "first transistor" in the present invention and has a gate through which it receives input signal IN+ and a drain through which it outputs an amplified signal OUT' obtained by amplifying differential input signals is output. The initial stage amplifying transistor Tr1 has a gate through which it receives input signal IN−. The source connection point between the initial stage amplifying transistors Tr1 and Tr2 is connected to a drain of the initial stage amplifying transistor Tr3. A source of the initial stage amplifying transistor Tr3 is electrically connected to the GND node. The source connection point between the initial stage amplifying transistors Tr1 and Tr2 is electrically connected to the GND node through the initial stage amplifying transistor Tr3 in the on state when the initial stage amplifier 11 operates to perform amplification of an input signal. "Amplification" referred to here may be power amplification or voltage amplification.

The bias circuit 31 supplies current biases to the gates of the initial stage amplifying transistors Tr1, Tr2, and Tr3 such that the magnitudes of the biases increase with a rise in circuit temperature. More specifically, the bias circuit 31 includes a bias circuit 31a and a bias circuit 31b. The transistors are different objects to which biases are to be supplied from the bias circuit 31a and the bias circuit 31b, and the values of the bias voltages supplied to the transistors are different from each other. The bias circuit 31a and the bias circuit 31b, however, have the same tendency (i.e., the same temperature-output characteristic) in changing the magnitudes of the biases with a change in circuit temperature and each have, for example, a characteristic B described below with reference to FIG. 11. In the descriptions of first to fourth embodiments, therefore, a common temperature characteristic of the bias circuits 31a and 31b is described as a "temperature characteristic of the bias circuit 31" for ease of description.

As shown in FIG. 4, the gates of the initial stage amplifying transistors Tr1 and Tr2 are connected to the bias circuit 31a through resistors R1 and R2, respectively. More specifically, one ends of the resistors R1 and R2 are connected to the gates of the initial stage amplifying transistors Tr1 and Tr2; the other ends of the resistors R1 and R2 are connected to each other; and the point of this connection is connected to the bias circuit 31a. The bias circuit 31a applies a bias voltage Vg12 to each of the resistors R1 and R2. On the other hand, the gate of the initial stage amplifying transistor Tr3 is connected to the bias circuit 31b through a resistor R3. Therefore, the bias circuit 31b applies a bias voltage Vg1 to the resistor R3. The values of the bias voltages Vg1 and Vg12 are designed so that the current equal to the total of the currents flowing through the initial stage amplifying transistors Tr1 and Tr2 flows through the initial stage amplifying transistor Tr3. The circuit configuration and operation of the differential amplifier are well known and the values of the biases to be provided for the transistors may be set on the basis of a well-known technique. Therefore, no further description will be made of them.

Figure 5:
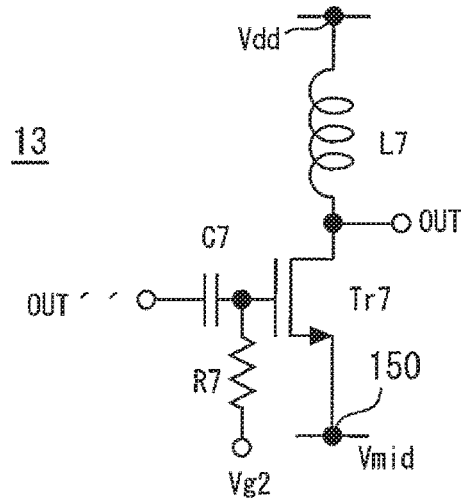
FIG. 5 is a circuit diagram of the final stage amplifier that the multistage amplifier according to the first embodiment of the present invention has.

FIG. 5 is a circuit diagram of the final stage amplifier 13 that the multistage amplifier 10 according to the first embodiment of the present invention has. The final stage amplifier 13 has an inductor L7, a capacitor C7, a resistor R7 and a final stage amplifying transistor Tr7. In this embodiment, the final stage amplifying transistor Tr7 corresponds to the "second transistor" in the present invention. A signal OUT" amplified by the initial stage amplifier 11 (initial stage amplifying transistors Tr1 and Tr2) and further amplified by the second stage amplifier 12 is input to a gate of the final stage amplifying transistor Tr7. From a drain of the final stage amplifying transistor Tr7, a signal OUT obtained by amplifying the signal OUT" input to the gate is output. A source of the final stage amplifying transistor Tr7 is connected to the intermediate node 150. The source of the final stage amplifying transistor Tr7 is electrically connected to the drains of the initial stage amplifying transistors Tr1 and Tr2 through the transistors Tr4 and Tr5 in the on state when the initial stage amplifier 11 operates to perform signal amplification. A bias voltage Vg2 from the bias circuit 32 described below is applied to a point of connection between the gate of the final stage amplifying transistor Tr7 and the capacitor C7.

Figure 6:
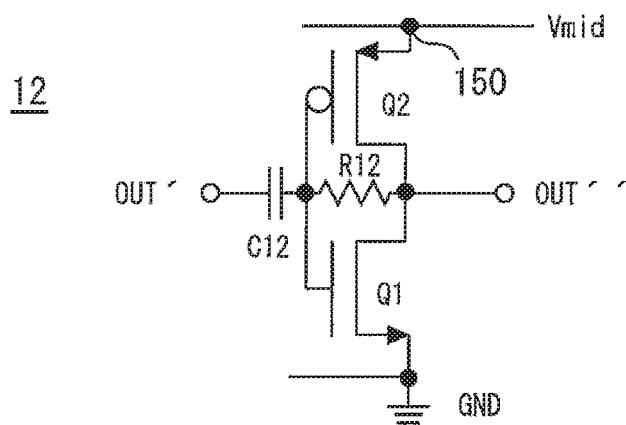
FIG. 6 is a circuit diagram of the second stage amplifier that the multistage amplifier according to the first embodiment of the present invention has.

FIG. 6 is a circuit diagram of the second stage amplifier 12 that the multistage amplifier 10 according to the first embodiment of the present invention has. A self-biased CMOS inverter shown in FIG. 6 is applied to the second stage amplifier 12. The self-biased CMOS inverter shown in FIG. 6 has an N-type MOSFET Q1 and a P-type MOSFET Q2 complimentarily connected to each other, a resistor R12 and a capacitor C12. The amplified signal OUT' output from the initial stage amplifier 11 is input to a point of connection between gates of the P-type MOSFET Q2 and the N-type MOSFET Q1 through the capacitor C12. The resistor R12 connects the gate connection point and a drain connection point between the P-type MOSFET Q2 and the N-type MOSFET Q1 to each other. The drain connection point between the P-type MOSFET Q2 and the N-type MOSFET Q1 is an output terminal through which the amplified signal OUT" is output. This output terminal is electrically connected to the gate of the final stage amplifying transistor Tr7. The second stage amplifier 12 further amplifies the first stage amplified signal OUT' input through the input terminal and outputs the second stage amplified signal OUT" to the output terminal.

The second stage amplifier 12 described above performs a preferable circuit operation to adjust the amount of current flowing through the intermediate node 150 so that variation in potential on the intermediate node 150 is limited. More specifically, the above-described second stage amplifier 12 changes the current caused to flow therethrough, on the basis of the potential on the connection point at which the intermediate node 150 and the second stage amplifier 12 are electrically connected to each other. A larger current can be drawn off from the intermediate node 150 through the second stage amplifier 12 by increasing the current caused to flow through the second stage amplifier 12. Conversely, by reducing the current caused to flow through the second stage amplifier 12, the drawn current from the intermediate node 150 can be reduced to add a current flowing from the intermediate node 150 into the initial stage amplifier 11. The second stage amplifier 12 thus performs a preferable circuit operation to add or drawn off a current at the intermediate node 150 on the basis of the potential on the connection point at which the intermediate node 150 and the second stage amplifier 12 are electrically connected to each other.

Figure 7:
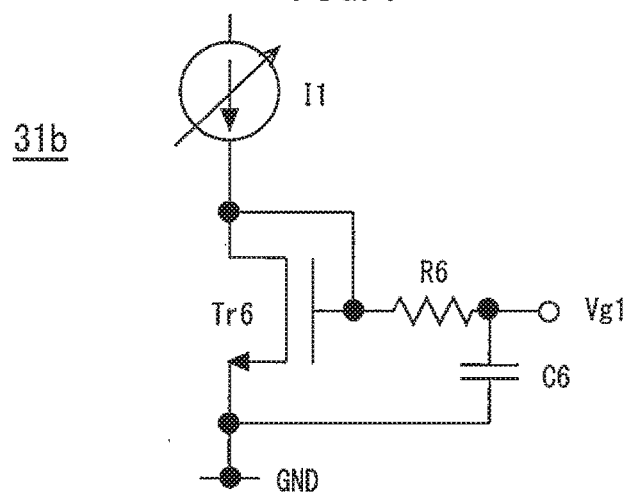
FIG. 7 is a circuit diagram of a bias circuit used for the initial stage amplifier according to the first embodiment of the present invention.

FIG. 7 is a circuit diagram of a bias circuit (more specifically, the bias circuit 31b) used for the initial stage amplifier 11 according to the first embodiment of the present invention. The bias circuit 31b is electrically connected to the gate of the initial stage amplifying transistor Tr3 through the resistor R3 to variably supply the bias voltage Vg1. The bias circuit 31b supplies a current bias to the gate of the initial stage amplifying transistor Tr3 so that the magnitude of the bias increases with a rise in circuit temperature. FIG. 7 discloses an example of a circuit capable of supplying such a current bias. The bias circuit 31b has a current source I1, a transistor Tr6 having an output current input to its drain from the current source I1 and having its source electrically connected to a GND node, a resistor R6 having its one end connected to a gate of the transistor Tr6, and a capacitor C6 connected between the other end of the resistor R6 and the source of the transistor Tr6. The gate and drain of the transistor Tr6 are electrically short-circuited. As current source I1, a proportional-to-absolute-temperature (PTAT) circuit having a positive temperature coefficient is used. Various circuit configurations for PTAT circuits are known and, therefore, will not be described in this specification.

As described above, the bias circuit 31 in the first embodiment includes the bias circuit 31a and the bias circuit 31b for adjusting the magnitudes of biases with the same temperature characteristic (characteristic B in the first embodiment, described below with reference to FIG. 11). While FIG. 7 shows an example of a circuit configuration for the bias circuit 31b, a temperature-output characteristic of the bias circuit 31a having the same tendency as the bias circuit 31b may also be realized by including in the bias circuit 31a the circuit configuration shown in FIG. 7 same as the bias circuit 31b. In any case, the same temperature-output characteristic as that of the bias circuit 31b can be set for the bias circuit 31a by using a circuit configuration such as a PTAT circuit. This makes it possible to change the magnitudes of the biases supplied to the gates of the initial stage amplifying transistors Tr1 to Tr3 with the same tendency according to the circuit temperature.

Figure 8:
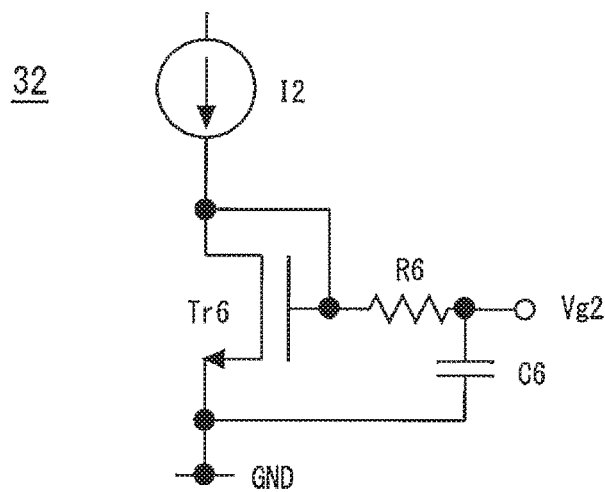
FIG. 8 is a circuit diagram of a bias circuit used for the final stage amplifier according to the first embodiment of the present invention.

FIG. 8 is a circuit diagram of a bias circuit (bias circuit 32) used for the final stage amplifier according to the first embodiment of the present invention. The bias circuit 32 is electrically connected to the gate of the final stage amplifying transistor Tr7 to variably supply the bias voltage Vg2. The bias circuit 32 supplies a current bias to the gate of the final stage amplifying transistor Tr7 so that the magnitude of the bias is constantly maintained with respect to change in circuit temperature. FIG. 8 shows an example of a circuit capable of supplying such a current bias. The circuit shown in FIG. 8 is the same as the bias circuit 31b shown in FIG. 7 except that the current source I1 is replaced with a current source I2. The current source I2 outputs a current of a constant magnitude regardless of temperature. In constructing the bias circuit 32, any of various well-known reference voltage circuits can be used and its circuit configuration is not restrictively specified; a bandgap reference circuit may be used.

In the embodiment, "circuit temperature" means the internal circuit temperature in the multistage amplifier 10. For example, if there is a temperature distribution in the multistage amplifier 10, the "circuit temperature" is a typical temperature such as average temperature. Strictly speaking, each of the temperatures of the initial stage amplifying transistors Tr1, Tr2, and Tr3 of the initial stage amplifier 11 and the temperature of the final stage amplifying transistor Tr7 of the final stage amplifier 13 is important, and the temperatures of the transistors are not precisely equal to each other. In some cases, there are small differences between the temperatures. In the embodiment, the temperatures are assumed to be substantially equal to each other and are treated collectively as "circuit temperature". The circuit temperature has a positive correlation with the temperature of the multistage amplifier 10. As a package structure for the multistage amplifier 10, any of various well-known package structures can be adopted in packaging using, for example, but not limited to, resin encapsulation or a metallic case. In any case, if the circuit temperature rises, the temperatures of the circuit elements constituting the initial stage amplifier 11 and the final stage amplifier 13 rise and the output characteristics of the initial stage amplifier 11 and the final stage amplifier 13 therefore change. For example, if the converter 5 is installed in various areas such as a cold climate area, a warm climate area and a torrid area, the average and the upper and lower limit values of the circuit temperature in the multistage amplifier 10 vary. Even in one area, the circuit temperature varies, for example, with change in atmospheric temperature.

[Operation of the Device According to the First Embodiment]

Figure 9:
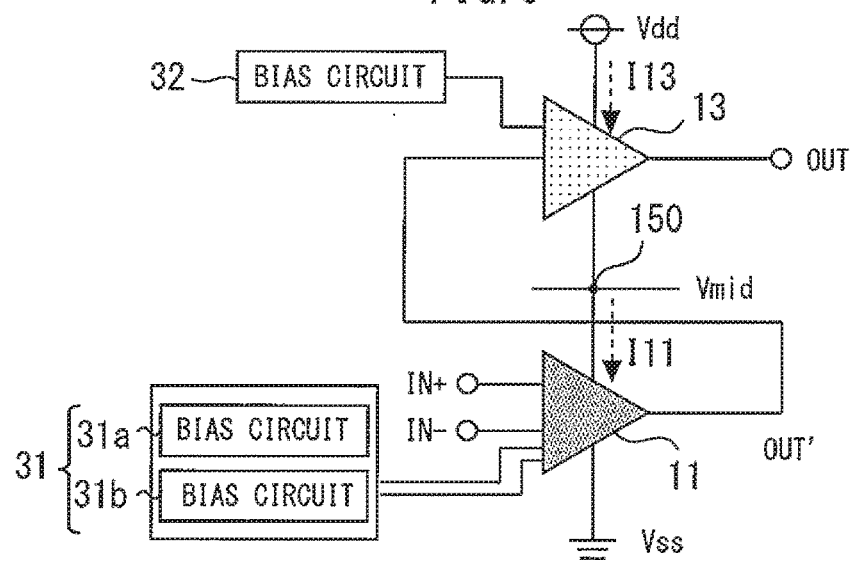
FIG. 9 is a diagram for explaining an intermediate node potential of the multistage amplifier according to the embodiment of the present invention.
Figure 10:
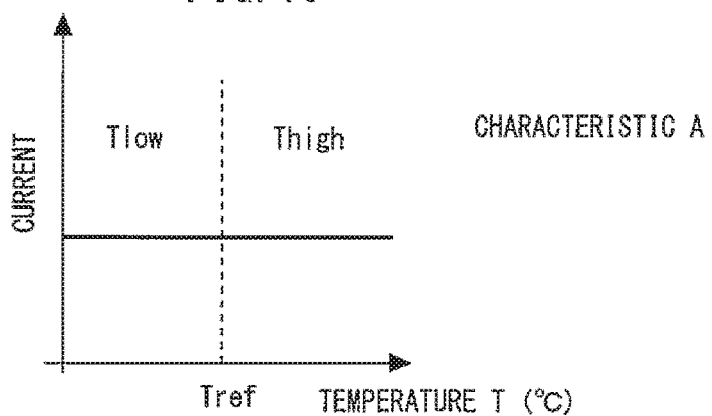
FIGS. 10 and 11 are diagrams showing temperature characteristics of the biases used in the multistage amplifier according to the first embodiment of the present invention.

FIG. 9 is a diagram for explaining an intermediate node potential Vmid of the multistage amplifier 10 according to the embodiment of the present invention. FIGS. 10 and 11 are diagrams showing temperature characteristics of the biases used in the multistage amplifier 10 according to the first embodiment of the present invention. The operation of the multistage amplifier 10 will be described by using these diagrams.

The temperature characteristics of the biases will first be described. For discrimination in the description, for convenience sake, the temperature characteristic shown in FIG. 10 is also referred to as "characteristic A" and the temperature characteristic shown in FIG. 11 is also referred to as "characteristic B". A reference temperature Tref in the diagrams is a temperature used as a reference in determination of the temperature characteristic. The reference temperature Tref can be set to an arbitrary value in designing the amplifier. For example, room temperature such as an absolute temperature 300K can be used as reference temperature Tref. For convenience sake, a high temperature region of temperatures equal to or higher than the reference temperature Tref is also referred to as "first temperature region Thigh" and a low temperature region below the reference temperature Tref is also referred to as "second temperature region Tlow".

With the characteristic A shown in FIG. 10, the magnitude of the bias is constantly maintained with respect to change in circuit temperature. It is preferable that the bias circuit 32 supplies the bias to the gate of the final stage amplifying transistor Tr7 in accordance with the characteristic A, because the linearity, which is one of characteristics of the final stage amplifier 13, is well maintained thereby.

Figure 11:
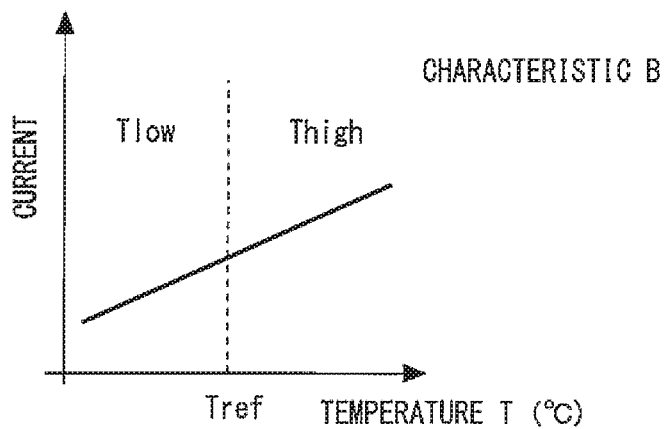

The characteristic B shown in FIG. 11 is such that the magnitude of the bias increases proportionally with a constant gradient with a rise in circuit temperature. It is preferable that the bias circuit 31a and the bias circuit 31b supply the bias Vg12 to the gate of the initial stage multiplying transistor Tr1, the bias Vg12 to the gate of the initial stage multiplying transistor Tr2, and the bias Vg1 to the gate of the initial stage multiplying transistor Tr3 in accordance with the characteristic B, because the gain, which is one of characteristics of the initial stage amplifier 11, is well maintained thereby. In general, if the bias is constant, the gain of the amplifier lowers with a rise in temperature. In biasing with the characteristic B, therefore, the bias is increased with a rise in temperature to compensate for the lowering of the gain.

With the embodiment described above, it has been demonstrated that the multistage amplifier 10 having a reduced power consumption and good characteristics can be obtained by combining a current reuse technique with a multistage amplifier and by adjusting the biases so as to compensate for a reduction in gain due to a rise in temperature. Even if the converter 5 is installed under any of various temperature conditions (e.g., in a high-temperature or low-temperature environment in which the atmospheric temperature changes largely), the multistage amplifier 10 can make the most of its amplification performance.

In a case where vertically stacked circuits are arranged in a conventional memory device, a digital (logic) circuit or an RF circuit (LNA+Buffer or VCO+MIX) from the viewpoint of current reuse, current biases for an upper stage and a lower stage in the vertical stack are ordinarily supplied with the same temperature characteristic. A multistage amplifier, however, differs in this respect and it is preferable to make different the temperature characteristics of current biases in order to satisfy characteristics respectively required of the initial and subsequent amplifiers.

Making different the temperature characteristics of current biases for different stages, however, entails a problem described below. For ease of the following description, the drain-source current of the initial stage amplifying transistor Tr3 of the initial stage amplifier 11 is assumed to be I11; the drain-source current of the MOSFETs constituting the second stage amplifier 12, I12; the drain-source current of the final stage amplifying transistor Tr7, I13.

If, as shown in FIG. 9, the second stage amplifier 12 is not provided, the operation is as described below. Since the initial stage amplifier 11 and the final stage amplifier 13 are a vertically stacked current reuse circuit, the current I11 flowing through one of them and the current I13 flowing through the other influence each other.

The operation in the first temperature region Thigh above the reference temperature Tref in the circuit shown in FIG. 9 will be considered. The current I13 is constant because the bias circuit 32 supplies the bias with the characteristic A. However, the bias given to the initial stage amplifying transistor Tr3 of the initial stage amplifier 11 is increased in the first temperature region Thigh above the reference temperature Tref because the bias circuit 31 (bias circuit 31b) supplies the bias with the characteristic B. In this case, the current I11 should be increased. In this case, a phenomenon occurs in which the current I11 transiently becomes larger than the current I13 and the intermediate node potential Vmid lowers. Such lowering of the potential is not preferable since the potential on the intermediate node 150 corresponds to the reference potential for the final stage amplifying transistor Tr7. Otherwise the final stage amplifier 13 as the upper stage in the vertically stacked circuit limits the current I11 and there is a possibility of the initial stage amplifier 11 as the lower stage in the vertically stacked circuit failing to function normally.

The operation in the second temperature region Tlow below the reference temperature Tref in the circuit shown in FIG. 9 will be considered. The bias circuit 31 makes the current bias smaller than when the circuit temperature is equal to the reference temperature Tref. As a result, the current I11 is reduced while the current I13 is constant; a phenomenon reverse to that described above occurs.

The inventor of the present invention conceived a technical idea of providing some current adjustment function to absorb the difference between currents I11 and I13 flowing in stages in a vertically stacked circuit such as shown in FIG. 9. More specifically, in the first embodiment, the second stage amplifier 12 having a circuit operation for adjusting the current flowing through the intermediate node 150 is provided. In the embodiment, a design is made such that I13=I11+I12 at the reference temperature Tref set to a certain temperature such as room temperature.

A case where the circuit temperature rises and the intermediate node potential Vmid lowers will first be described. The second stage amplifier 12 is a self-biased CMOS inverter. When the intermediate node potential Vmid lowers, the drain-source current I12 through the MOSFETs Q1 and Q2 constituting the second stage amplifier 12 is reduced. Also, in the case of biasing with the bias characteristic B shown in FIG. 11, the current I11 of the initial stage amplifier 11 should be increased since the circuit temperature increases. The amount of current having failed to flow through the second stage amplifier 12 due to the lowering of the intermediate node potential Vmid is thereby caused to flow through the initial stage amplifier 11. The relationship: I13=I11+I12 can therefore be maintained even when the circuit temperature is increased, thus constantly maintaining the intermediate node potential Vmid.

A case where the circuit temperature lowers and the intermediate node potential Vmid rises will subsequently be described. When the intermediate node potential Vmid rises, the drain-source current I12 through the MOSFETs is increased in the relationship reverse to that described above. Also, in the case of biasing with the bias characteristic B shown in FIG. 11, the current I11 of the initial stage amplifier 11 should be reduced since the circuit temperature lowers. When the intermediate node potential Vmid rises, the second stage amplifier 12 deprives the initial stage amplifier 11 of a current. The relationship: I13=I11+I12 can thereby be maintained, thus constantly maintaining the intermediate node potential Vmid.

Figure 15:
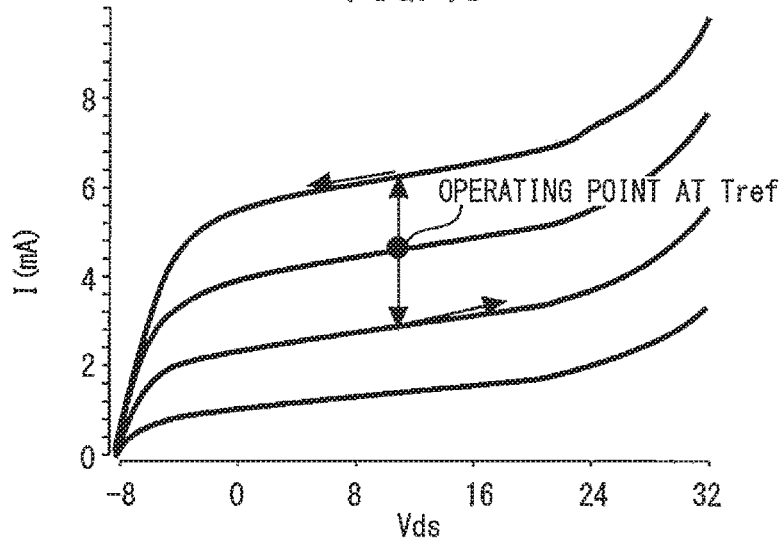
FIGS. 15 and 16 are diagrams for explaining the operation of the vertically stacked multistage amplifier shown in FIG. 9.
Figure 16:
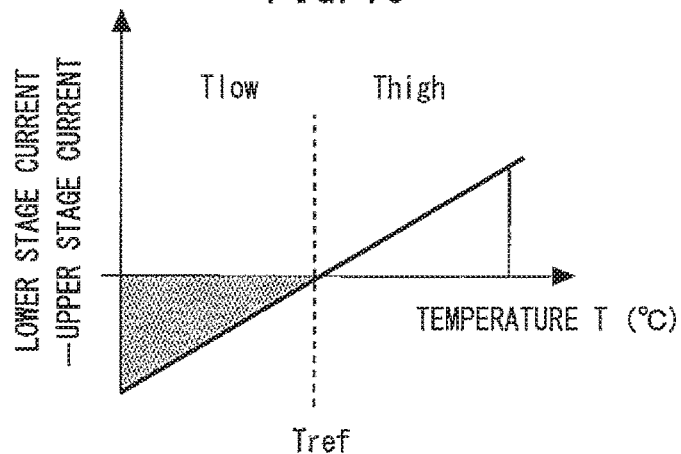

FIGS. 15 and 16 are diagrams for explaining the operation of the vertically stacked multistage amplifier 10 shown in FIG. 9. In FIG. 15, the operating point at the reference temperature Tref is indicated by a solid round mark. When the circuit temperature rises, the bias circuit 31 increases the bias, so that the operating point is shifted to an upper left point as indicated by an upward arrow and a leftward arrow in FIG. 15. Conversely, when the circuit temperature lowers, the bias circuit 31 reduces the bias, so that the operating point is shifted to a lower right point in FIG. 15. The following description is made with reference to FIG. 16 by considering the difference between the currents I11 and I13. The ordinate of FIG. 16 represents the difference between the current through the initial stage amplifier 11 in the lower stage (i.e., current I11) and the current through the final stage amplifier 13 in the upper stage (i.e., current I13) in the vertically stacked circuit shown in FIG. 9. In FIG. 16, the value on the ordinate (the value of I11-I13) intersects the abscissa at the reference temperature Tref. The difference between the I11 and I13 at the reference temperature Tref is referred to as reference value I0 for convenience sake.

In the first temperature region Thigh above the reference temperature Tref, the bias circuit 31 increases the bias. Therefore the current I11 required for the initial stage amplifier 11 is higher in this region than at the reference value I0. On the other hand, the current flowing through the final stage amplifier 13 is constant since the bias from the bias circuit 32 is constant independently of the temperature. In the first temperature region Thigh, therefore, the value on the ordinate (i.e., the value obtained by subtracting the current I13 from the current I11) becomes larger on the positive side when the temperature is increased as shown in FIG. 16. In this situation, if the current I12 through the second stage amplifier 12 is constant, the intermediate node potential Vmid is lowered and the intermediate node 150 is maintained at the lowered potential. In the first embodiment, however, the current I12 is reduced according to the degree of lowering of the intermediate node potential Vmid when the intermediate node potential Vmid lowers, since the second stage amplifier 12 is a self-biased CMOS inverter. The lowering of the intermediate node potential Vmid can thus be limited.

Conversely, in the second temperature region Tlow below the reference temperature Tref, the bias circuit 31 makes the bias lower than at the temperature Tref. Therefore the current I11 required for the initial stage amplifier 11 is lower in this region than at the reference value I0. On the other hand, the current I13 flowing through the final stage amplifier 13 is constant since the bias from the bias circuit 32 is constant independently of the temperature. In the second temperature region Tlow, therefore, the value on the ordinate (i.e., the value obtained by subtracting the current I13 from the current I11) becomes larger on the negative side when the temperature is reduced as shown in FIG. 16. In this situation, if the current I12 through the second stage amplifier 12 is constant, the intermediate node potential Vmid rises and the intermediate node 150 is maintained at the potential after the rise. In the first embodiment, however, the current I12 is increased according to the degree of rise in the intermediate node potential Vmid when the intermediate node potential Vmid rises, since the second stage amplifier 12 is a self-biased CMOS inverter. The rise in the intermediate node potential Vmid can thus be limited.

In the first embodiment, as described above, an increase or reduction in the current I12 flowing through the second stage amplifier 12 when the current bias for the initial stage amplifier 11 is increased or reduced can be added or subtracted in relation to the initial stage amplifier 11. As a result, the intermediate node potential Vmid can be maintained at the constant potential. That is, in the first embodiment, the second stage amplifier 12 can stabilize the intermediate node potential Vmid by adjusting the current flowing through the intermediate node 150. Consequently, the multistage amplifier having a reduced power consumption and good characteristics can be operated with stability.

Since the adjustment is performed on the basis of the intermediate node potential Vmid, the intermediate node potential Vmid can be adjusted even when variation in intermediate node potential Vmid is caused due to manufacturing variation. It is thus possible to make use of the advantage of the function of adjusting the intermediate node potential Vmid in such a case as well as in the case where the current bias is changed with temperature.

When the bias circuit 31 increases the bias with a rise in temperature, the multistage amplifier 10 operates, for example, as described below. First, it is assumed that, in an initial state, the current I11 flowing through the initial stage amplifier 11 is 10 mA, the current I12 flowing through the second stage amplifier 12 is 20 mA and the current I13 flowing through the final stage amplifier 13 is 30 mA. Next, it is assumed that the bias circuit 31 increases the bias with a rise in temperature so that the current flowing through the initial stage amplifier 11 is 12 mA. A change of the current I12 flowing through the second stage amplifier 12 to a minus 2 mA from the initial state, i.e., a change of the current I12 flowing through the second stage amplifier 12 to 18 mA, suffices for supply of the current of a plus 2 mA to the initial stage amplifier 11. Simultaneously with this rise in temperature, the current as seen in the initial stage amplifier 11 is 20% increased and the current as seen in the second stage amplifier 12 is 10% reduced. The change in current in the second stage amplifier 12 is gentler than the change in current in the initial stage amplifier 11. That is, when a change in temperature occurs, the rate of change in output current (10%) in the second stage amplifier 12 with a change in the bias from the bias circuit 31 is lower than the rate of change in output current (20%) in the initial stage amplifier 11. Also, while the initial stage amplifier 11 is a differential amplifier, the second stage amplifier 12 is a CMOS inverter. There is a difference in gain characteristic therebetween due to the difference between the circuit configurations. The balance between the currents respectively flowing through the initial stage amplifier 11 and the second stage amplifier 12 may be adjusted by considering these points while satisfying performance requirements with respect to the entire multistage amplifier 10. The numeric values shown above are only a concrete example, to which the present invention is not limited.

Comparison with the circuit configuration disclosed in Japanese Patent Laid-Open No. 2003-332864 will be made for description of the advantage of use of the self-biased CMOS inverter in the first embodiment. A current Is0 is drawn off through a resistor Rs0 from a connection point corresponding to the intermediate node in Japanese Patent Laid-Open No. 2003-332864. The amount of current drawn off through the resistor Rs0 changes linearly with respect to a change in potential ($\Delta V$) (that is, $I=\Delta V/R$). On the other hand, the self-biased CMOS inverter operates in accordance with the current square law on the basis of the current-voltage characteristic of the MOSFETs. That is, the self-biased CMOS inverter can change the amount of drawn-off current as the second power of a change in potential (i.e., $I \propto \Delta V^2$). In the first embodiment, the second stage amplifier 12, i.e., the self-biased CMOS inverter, functions to adjust the current flowing through the intermediate node 150. Advantageously, therefore, the effect of maintaining the intermediate node potential Vmid is high.

Figure 17:
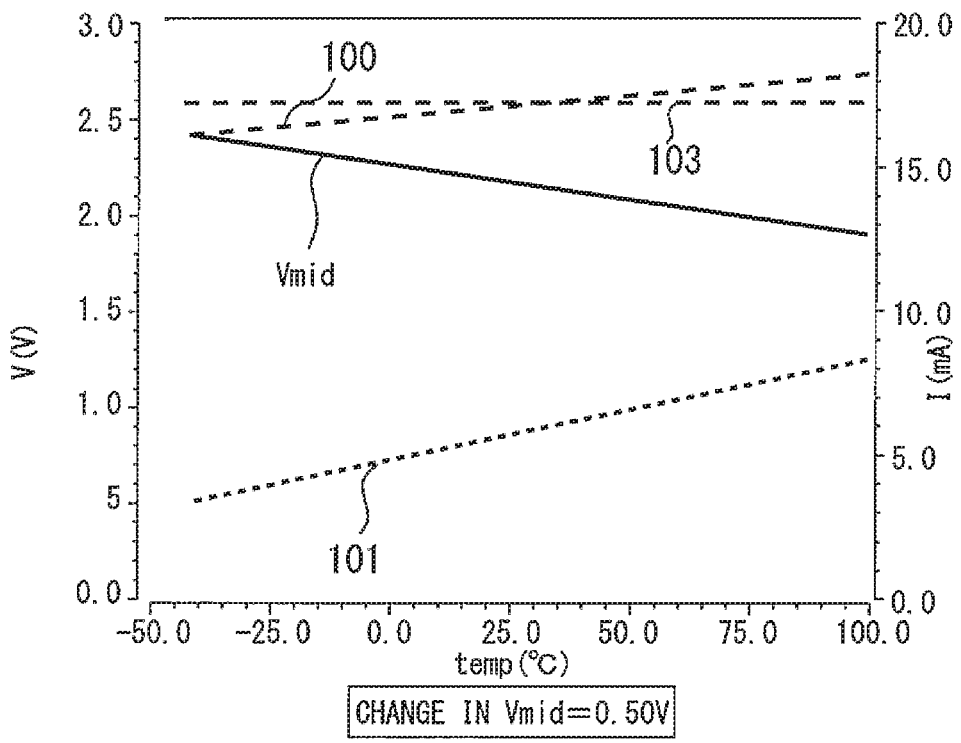
FIGS. 17 and 18 are diagrams for explaining the effect of the multistage amplifier 10 according to the first embodiment of the present invention.
Figure 18:
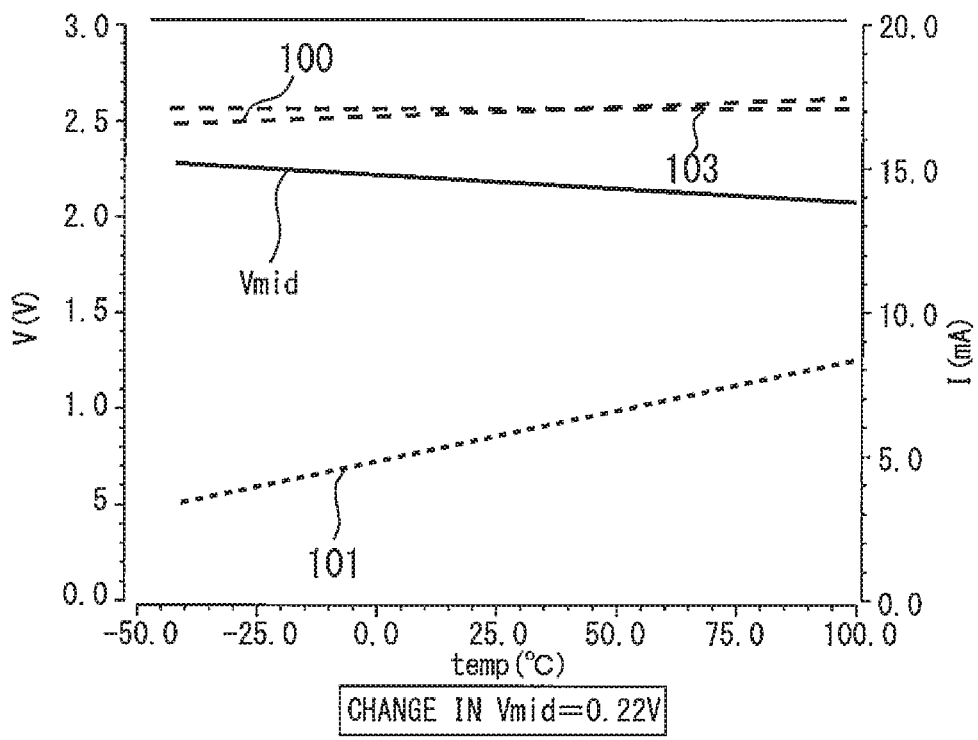

FIGS. 17 and 18 are diagrams for explaining the effect of the multistage amplifier 10 according to the first embodiment of the present invention. FIG. 17 is a graph when the current changing linearly with respect to a change in potential ($\Delta V$) was drawn off by connecting a resistor to the intermediate node 150 as in the case of the technique according to Japanese Patent Laid-Open No. 2003-332864. FIG. 18 shows the results of adjustment of the current through the intermediate node 150 performed by using the self-biased CMOS inverter, which corresponds to the operation of the multistage amplifier 10 according to the first embodiment. As described above, the self-biased CMOS inverter can change the current as the second power of a change in potential (i.e., $I \propto \Delta V^2$). The resulting characteristics shown in FIG. 18 are better than those shown in FIG. 17. More specifically, the initial stage amplifier 11 has a positive temperature characteristic as its current characteristic 101. The actual current characteristic 100 of the final stage amplifier 13 has a small gradient in comparison with the flat ideal current characteristic 103 of the final stage amplifier 13. Referring to FIG. 17, the intermediate node potential changes by 0.5 V in a temperature region from minus 50° C. to plus 100° C. Referring to FIG. 18, the change in intermediate node potential Vmid in the same temperature region is limited to 0.22 V.

Figure 12:
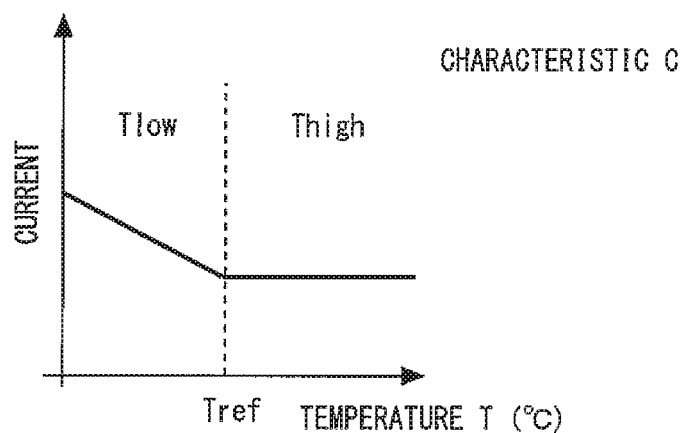
FIGS. 12 to 14 are diagrams showing other examples of the temperature characteristics of the biases used in the multistage amplifier according to the first embodiment of the present invention.
Figure 13:
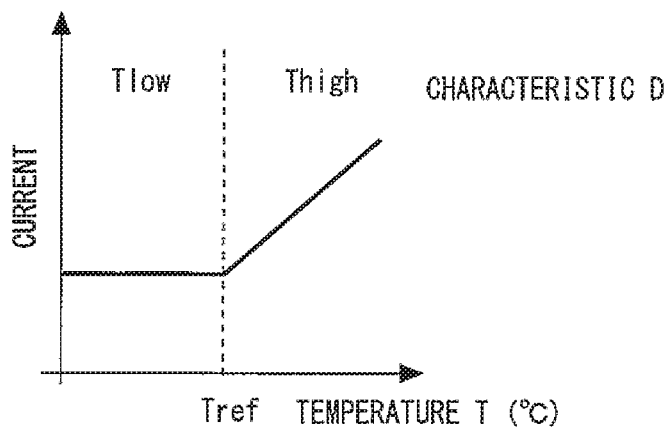
Figure 14:
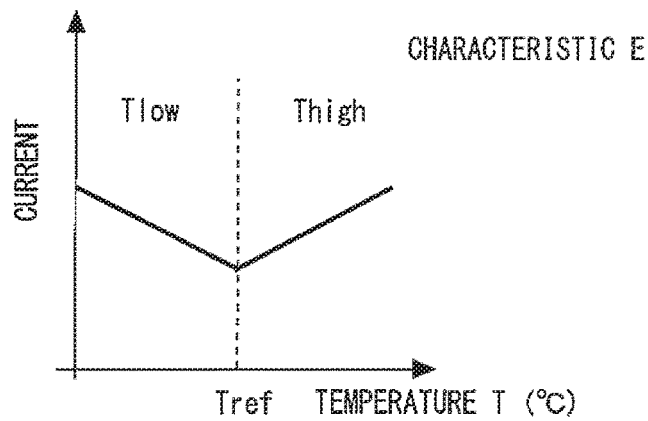

FIGS. 12 to 14 are diagrams showing other examples of the temperature characteristics of the biases used in the multistage amplifier 10 according to the first embodiment of the present invention. For discrimination in the description, for convenience sake, the temperature characteristic shown in FIG. 12 is also referred to as "characteristic C", the temperature characteristic shown in FIG. 13 as "characteristic D", and the temperature characteristic shown in FIG. 14 as "characteristic E".

(Characteristic C)

With characteristic C shown in FIG. 12, the magnitude of the bias is constantly maintained with respect to the circuit temperature in the first temperature region Thigh of temperatures equal to or higher than the predetermined reference temperature Tref. In the second temperature region Tlow below the reference temperature Tref, the bias is increased with reduction in the circuit temperature. The circuit configuration of the bias circuit 32 may be designed to have this characteristic C. More specifically, a temperature characteristic of the current source I2 may be designed. An effect of improving the linearity of the amplifier can be obtained by increasing the bias with reduction in circuit temperature in the second temperature region Tlow on the lower temperature side.

(Characteristic D)

With characteristic D shown in FIG. 13, the bias is increased with a rise in circuit temperature in the first temperature region Thigh of temperatures equal to or higher than the predetermined reference temperature Tref. In the second temperature region Tlow below the reference temperature Tref, the bias is constantly maintained with respect to the circuit temperature. The circuit configuration of the bias circuit 31 may be designed to have this characteristic D. More specifically, a temperature characteristic of the current source I1 may be designed.

(Characteristic E)

With characteristic E shown in FIG. 14, the bias circuit 31 increases the bias with a rise in circuit temperature in the first temperature region Thigh of temperatures equal to or higher than the predetermined reference temperature Tref. With characteristic E, in the second temperature region Tlow, the bias is increased with reduction in circuit temperature. That is, a temperature characteristic is exhibited in "V-shaped" form on the current-temperature characteristic graph with a lower limit peak value at the reference temperature Tref. The circuit configuration of the bias circuit 31 may be designed to have this characteristic E. More specifically, a temperature characteristic of the current source I1 may be designed.

The bias circuit 32 may change the magnitude of the current bias with characteristic A (FIG. 10) or characteristic C (FIG. 12). The bias circuit 31 may change the magnitude of the current bias with one of characteristics B to D (FIG. 11, FIG. 13, FIG. 14). Thus, a combination of "characteristic A" and "one of characteristics B, D, and E" or a combination of "characteristic C" and "one of characteristics B, D, and E" is possible.

In the first embodiment, the second stage amplifier 12 can adjust the current on the basis of the intermediate node potential Vmid. With any selection from the above-described characteristics A to E as the characteristics of the bias circuit 31 and the bias circuit 32, therefore, variation in intermediate node potential Vmid can be limited.

In designing the bias circuits having certain ones of the characteristics C to E, suitable ones of various well-known techniques including, for example, the above-mentioned PTAT and bandgap reference may be used. Therefore, concrete circuit configurations, design parameters of circuit elements, etc., will not be described.

Second Embodiment

Figure 19:
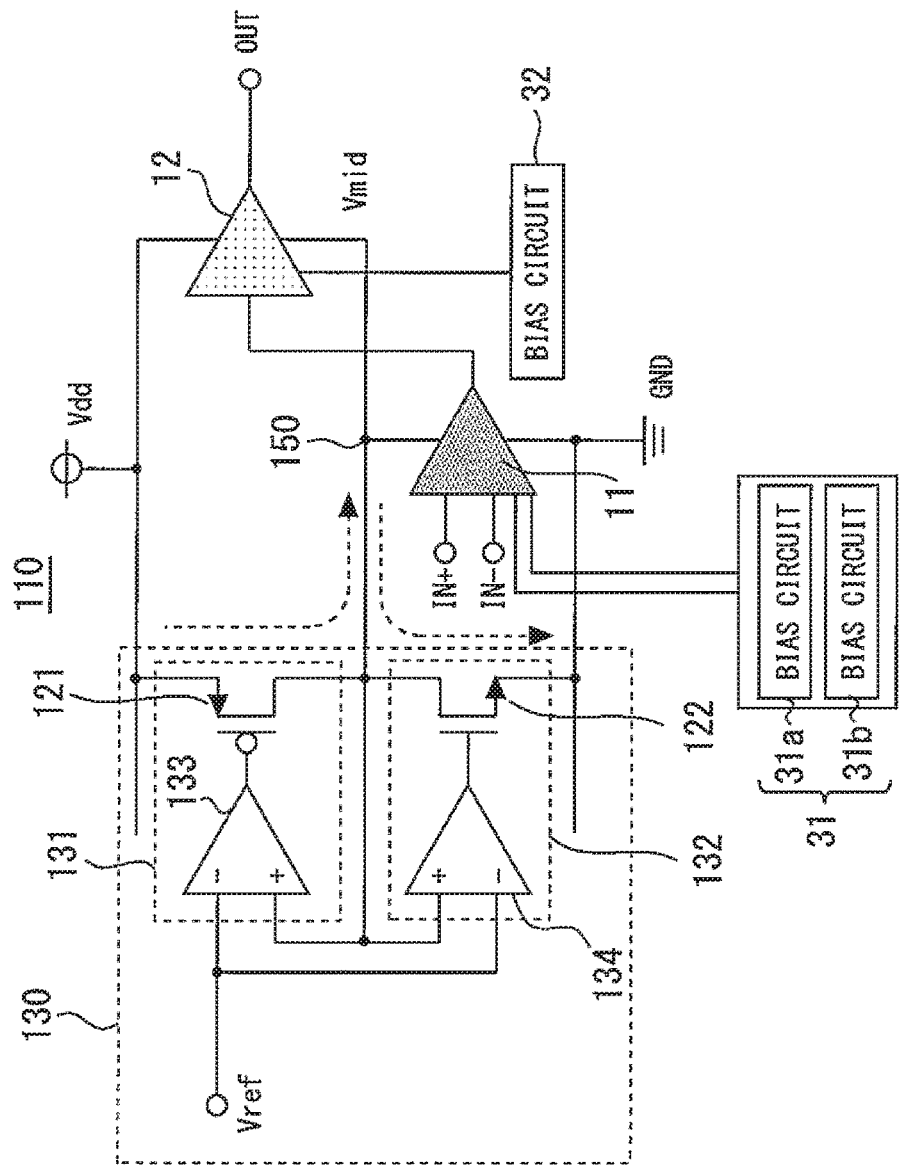
FIG. 19 is a circuit diagram of a multistage amplifier according to a second embodiment of the present invention.

FIG. 19 is a circuit diagram of a multistage amplifier 110 according to a second embodiment of the present invention. The multistage amplifier 110 according to the second embodiment is formed by adding an adjustment circuit 130 while removing the second stage amplifier 12. That is, a two-stage amplifier is formed in the second embodiment. In other respects, the configuration of the amplifier provided in the second embodiment is the same as that of the amplifier 10 according to the first embodiment described above. Various modifications described above with respect to the first embodiment can also be made in the same way with respect to the second embodiment. The same modifications in the second embodiment will not be described. Since a configuration similar to that in the first embodiment is provided, biases are also adjusted with the bias circuit 31 in the second embodiment so as to compensate for a reduction in gain due to a rise in temperature. The multistage amplifier having a reduced power consumption and good characteristics can therefore be obtained, as in the case of the first embodiment.

The adjustment circuit 130 performs a preferable circuit operation to adjust the amount of current flowing through the intermediate node 150 so that variation in potential on the intermediate node 150 is limited, as does the second stage amplifier 12 in the first embodiment. More specifically, the adjustment circuit 130 performs a preferable circuit operation to add or drawn off a current at the intermediate node 150 on the basis of the potential on the connection point at which the intermediate node 150 and the adjustment circuit 130 are electrically connected to each other.

The adjustment circuit 130 has a current adding circuit 131 and a current drawing-off circuit 132. The current adding circuit 131 includes an upper stage transistor 121 (the third transistor according to the present invention) and an upper stage operational amplifier 133. The upper stage transistor 121 has a drain, a gate and a source to be electrically connected to the power supply potential. A positive input to the upper stage operational amplifier 133 is electrically connected to the intermediate node 150. An output from the upper stage operational amplifier 133 is supplied to the gate of the upper stage transistor 121.

The current drawing-off circuit 132 includes a lower stage transistor 122 (the fourth transistor according to the present invention) and a lower stage operational amplifier 134. The lower stage transistor 122 has a drain electrically connected to the drain of the upper stage transistor 121, a source to be electrically connected to the GND node, i.e., the reference potential, and a gate. The point of connection between the drain of the upper stage transistor 121 and the drain of the low stage transistor 122 is electrically connected to the intermediate node 150. The positive input of the lower stage operational amplifier 134 is electrically connected to the intermediate node 150. The reference voltage Vref is applied to a negative input of the lower stage operational amplifier 134. An output from the lower stage operational amplifier 134 is supplied to the gate of the lower stage transistor 122.

Figure 20:
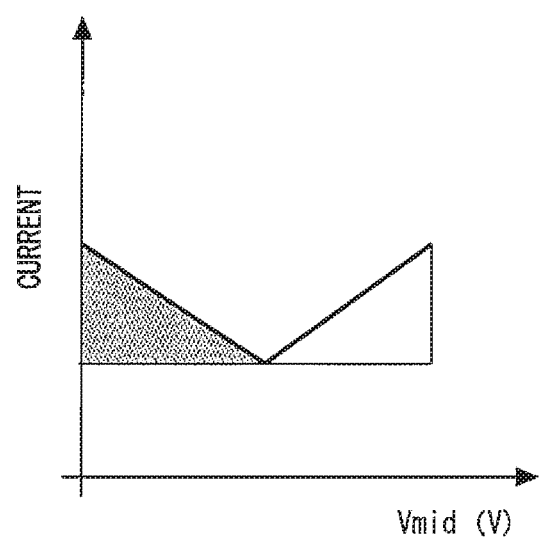
FIG. 20 is a diagram for explaining the operation of the multistage amplifier according to the second embodiment of the present invention.

FIG. 20 is a diagram for explaining the operation of the multistage amplifier 110 according to the second embodiment of the present invention. The upper stage transistor 121 functions as a switch for controlling electrical conduction between the power supply node Vdd and the intermediate node 150, and adjusts the amount of current added at the intermediate node 150. The lower stage transistor 122 functions as a switch for controlling electrical conduction between the intermediate node 150 and the GND node, and adjusts the amount of current drawn off from the intermediate node 150. When the intermediate node potential Vmid deviates from the reference voltage Vref, one of the operational amplifiers opens the switch to enable the necessary amount of current to flow until the intermediate potential (3) becomes substantially equal to the reference voltage (4).

Figure 21:
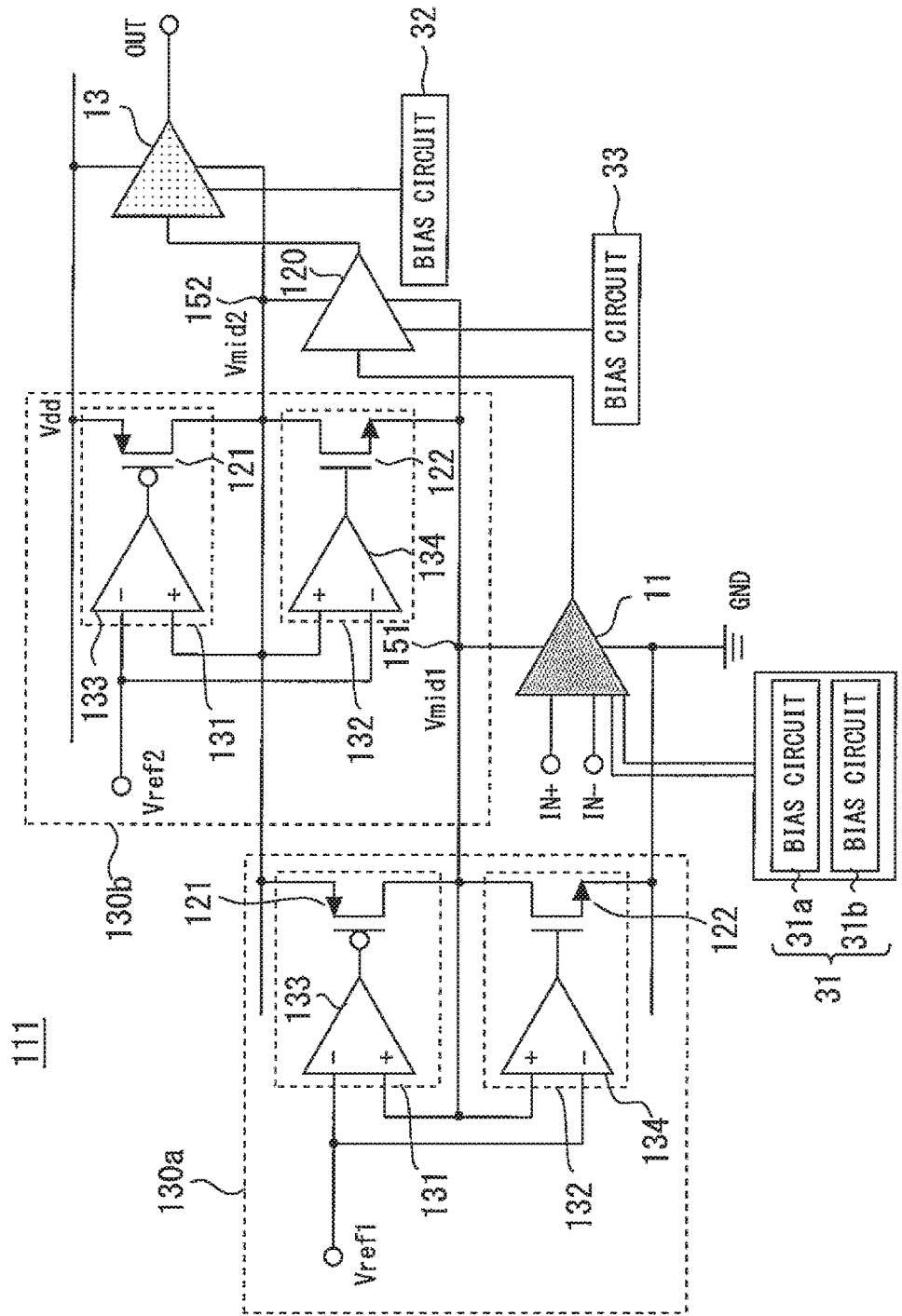
FIGS. 21 and 22 are diagrams showing modified examples of the multistage amplifier according to the second embodiment of the present invention.
Figure 22:
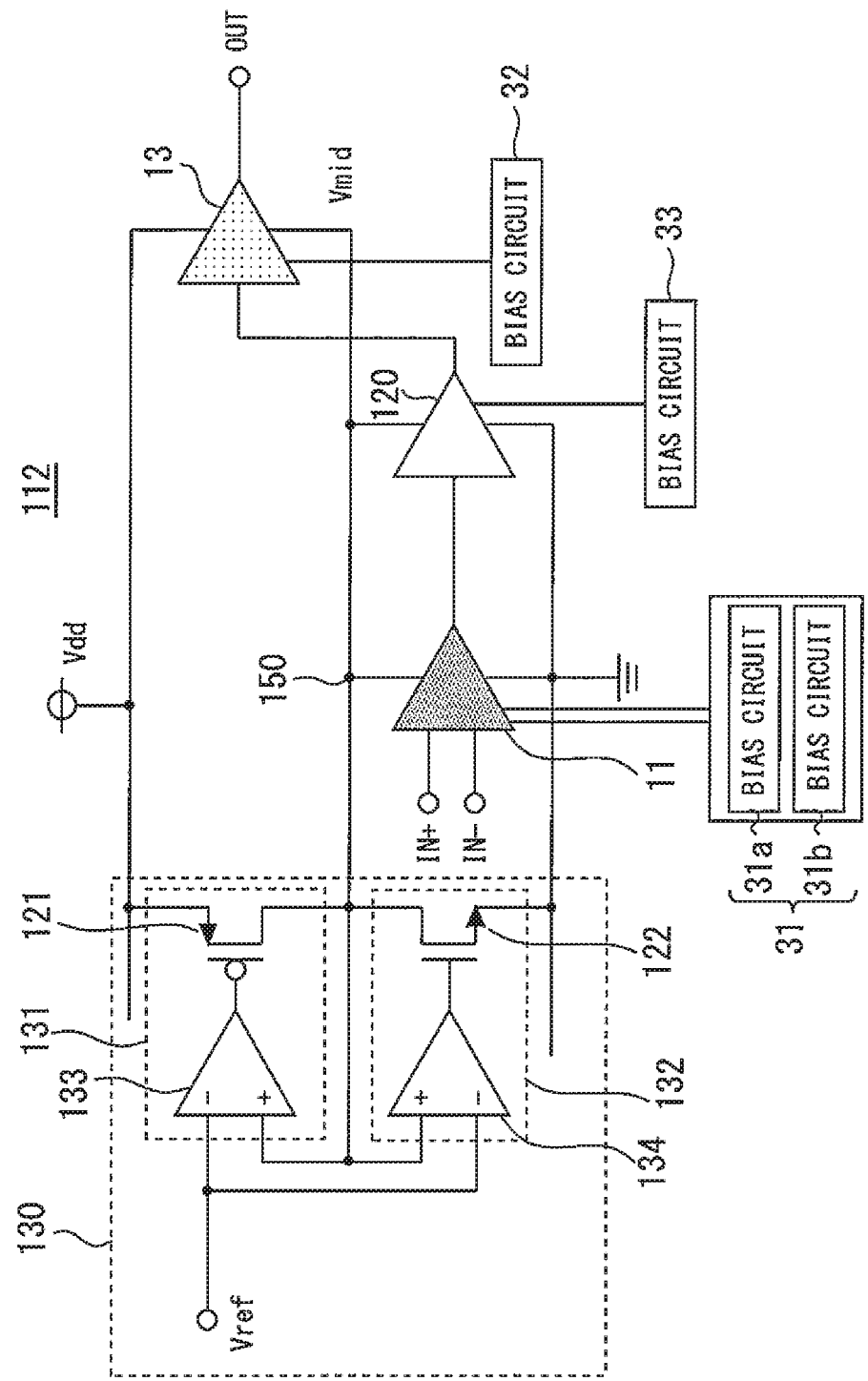

FIGS. 21 and 22 are diagrams showing modified examples of the multistage amplifier 110 according to the second embodiment of the present invention. To a multistage amplifier 111 shown in FIG. 21 and a multistage amplifier 112 shown in FIG. 22, a second stage amplifier 120 and a bias circuit 33 are added, thereby enabling three-stage amplification. The second stage amplifier 120, however, is not the second stage amplifier 12 (self-biased CMOS inverter) according to the first embodiment but a combination of, for example, a circuit such as shown in FIG. 4 or 5 and a bias circuit 33 such as shown in FIG. 6. The output characteristic of the bias circuit 33 is made, for example, the same as that of the bias circuit 31.

Referring to FIG. 21, the number of stages in which components are stacked is three. The connection relationship when the components are vertically stacked and connected in three stages may be such that each of the electrical connection between the initial stage amplifier 11 and the second stage amplifier 120 and the electrical connection between the second stage amplifier 120 and the final stage amplifier 13 is the same as the connection relationship when the initial stage amplifier 11 and the final stage amplifier 13 are connected as shown in FIG. 19. In this case, two adjustment circuits each identical to the adjustment circuit 130 shown in FIG. 19 are used. That is, adjustment circuits 130a and 130b are provided. With the adjustment circuit 130a, a potential Vmid1 at a first intermediate node 151 at which the initial stage amplifier 11 and the second stage amplifier 120 are connected to each other is adjusted so as to be equal to a reference voltage Vref1. With the adjustment circuit 130b, a potential Vmid2 at a second intermediate node 152 at which the second stage amplifier 120 and the final stage amplifier 13 are connected to each other is adjusted so as to be equal to a reference voltage Vref2.

Referring to FIG. 22, the number of stages in which components are stacked is two. This corresponds to a form having the second stage amplifier 120 in place of the second stage amplifier 12 in the first embodiment.

Third Embodiment

Figure 23:
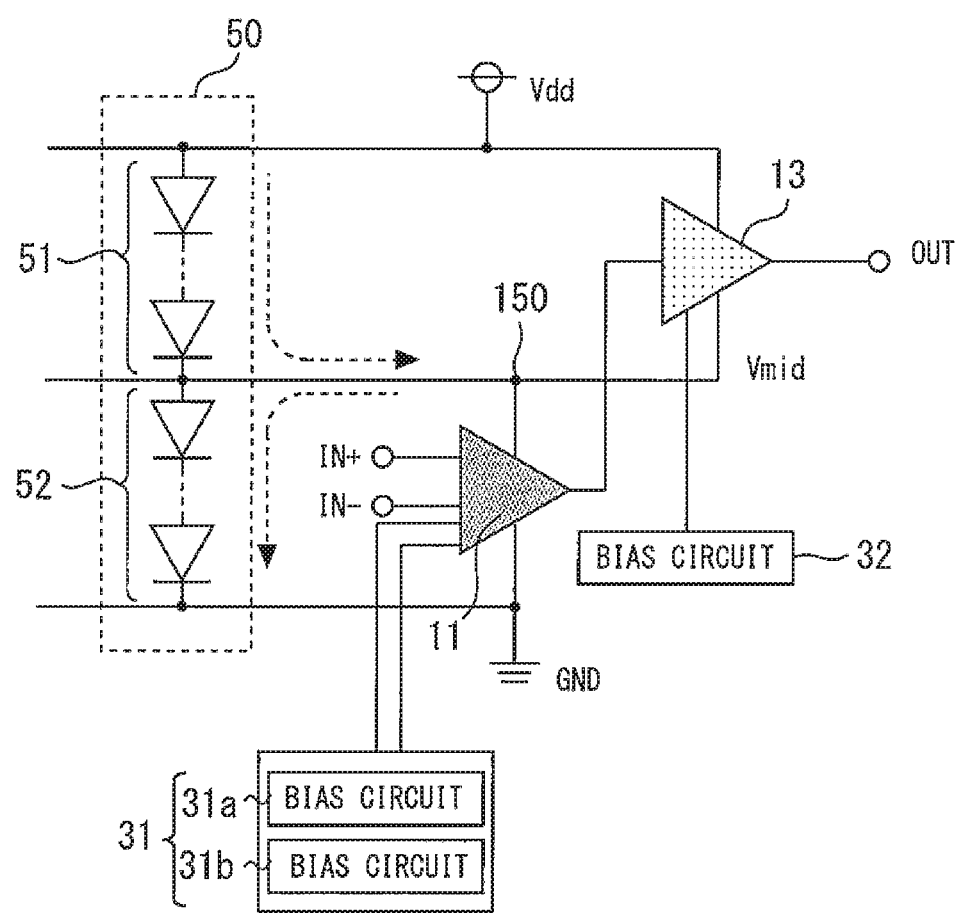
FIG. 23 is a circuit diagram of a multistage amplifier according to a third embodiment of the present invention.

FIG. 23 is a circuit diagram of a multistage amplifier 210 according to a third embodiment of the present invention. The multistage amplifier 210 according to the third embodiment is formed by replacing the adjustment circuit 130 with an adjustment circuit 50 including an upper stage diode series circuit 51 and a lower stage diode series circuit 52. In other respects, the configuration of the amplifier provided in the third embodiment is the same as that of the multistage amplifier 110 according to the second embodiment described above. Various modifications described above with respect to the first embodiment can also be made in the third embodiment. Also in the third embodiment, biases are adjusted with the bias circuit 31 as in the case of the first embodiment so as to compensate for a reduction in gain due to a rise in temperature. The multistage amplifier having a reduced power consumption and good characteristics can therefore be obtained, as in the case of the first embodiment.

The upper stage diode series circuit 51 and the lower stage diode series circuit 52 perform a preferable circuit operation to adjust the amount of current flowing through the intermediate node 150 so that variation in potential on the intermediate node 150 is limited, as does the second stage amplifier 12 in the first embodiment or the adjustment circuit 130 in the second embodiment. More specifically, the upper stage diode series circuit 51 and the lower stage diode series circuit 52 perform a preferable circuit operation to add or drawn off a current at the intermediate node 150 on the basis of the potential on the connection point at which the intermediate node 150 and the upper stage and lower stage diode series circuits 51 and 52 are electrically connected to each other.

The lower stage diode series circuit 52 is formed by electrically connecting a plurality of diodes one to another in the forward direction, and corresponds to the current drawing-off circuit according to the third embodiment. The upper stage diode series circuit 51 is formed by electrically connecting a plurality of diodes one to another in the forward direction, and corresponds to the current adding circuit according to the third embodiment. A connection point between the anode end of the lower stage diode series circuit 52 and the cathode end of the upper stage diode series circuit 51 is electrically connected to the intermediate node 150. The cathode end of the lower stage diode series circuit 52 is electrically connected to the sources of the initial stage amplifying transistors Tr1 and Tr2. The sources of the initial stage amplifying transistors Tr1 and Tr2 are electrically connected to the reference potential terminal while the initial stage amplifier 11 is operating, as described above. The anode end of the upper stage diode series circuit 51 is electrically connected to the drain of the final stage amplifying transistor Tr7.

When the intermediate node potential Vmid lowers, the potential difference between the opposite ends of the upper stage diode series circuit 51 becomes larger. When the potential difference between the opposite ends of the upper stage diode series circuit 51 becomes equal to or larger than the sum of the forward voltages of all the diodes constituting the upper stage diode series circuit 51, a current flows through the upper stage diode series circuit 51. The current is thereby added at the intermediate node 150. After the current starts flowing, a larger amount of current can be added at the intermediate node 150 if the potential on the intermediate node 150 is lower. When the intermediate node potential Vmid rises, the potential difference between the opposite ends of the lower stage diode series circuit 52 becomes larger. When the potential difference between the opposite ends of the lower stage diode series circuit 52 becomes equal to or larger than the sum of the forward voltages of all the diodes constituting the lower stage diode series circuit 52, a current flows through the lower stage diode series circuit 52. As a result, the current is drawn off from the intermediate node 150. After the current starts flowing, a larger amount of current can be drawn off from the intermediate node 150 if the potential on the intermediate node 150 is higher.

By making use of this, addition or drawing-off of a current at the intermediate node 150 can be performed when the intermediate node potential Vmid deviates from a voltage designed in advance. Each of the voltage when a current flows through the lower stage diode series circuit 52 and the voltage when a current flows through the upper stage diode series circuit 51 can be adjusted to the desired value by means of the forward voltage of the diodes and the number of diodes in the series connection. However, the adjustable voltage is limited to an integer multiple of the forward voltage.

Figure 24:
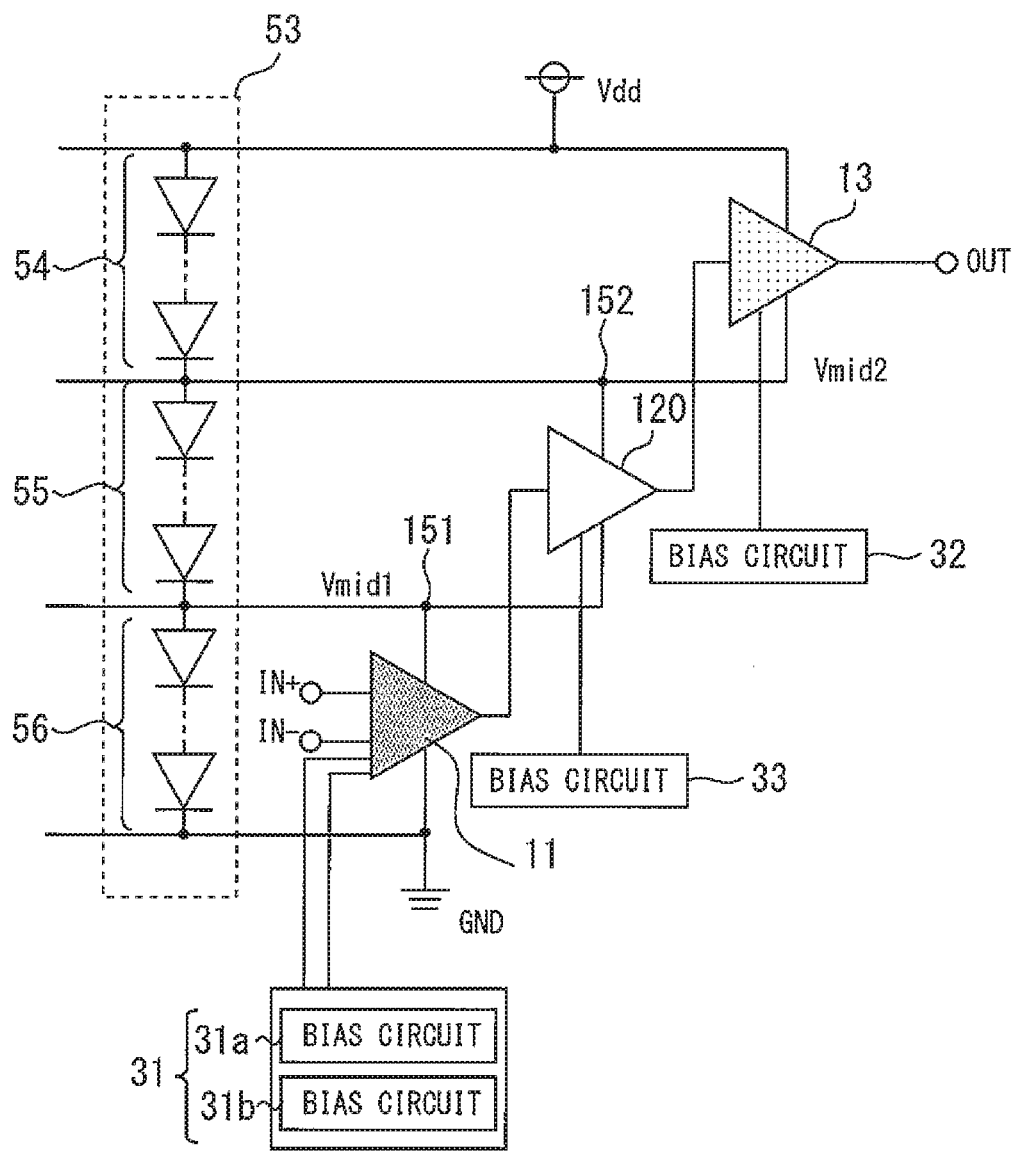
FIGS. 24 and 25 are diagrams showing modified examples of the multistage amplifier according to the third embodiment of the present invention.
Figure 25:
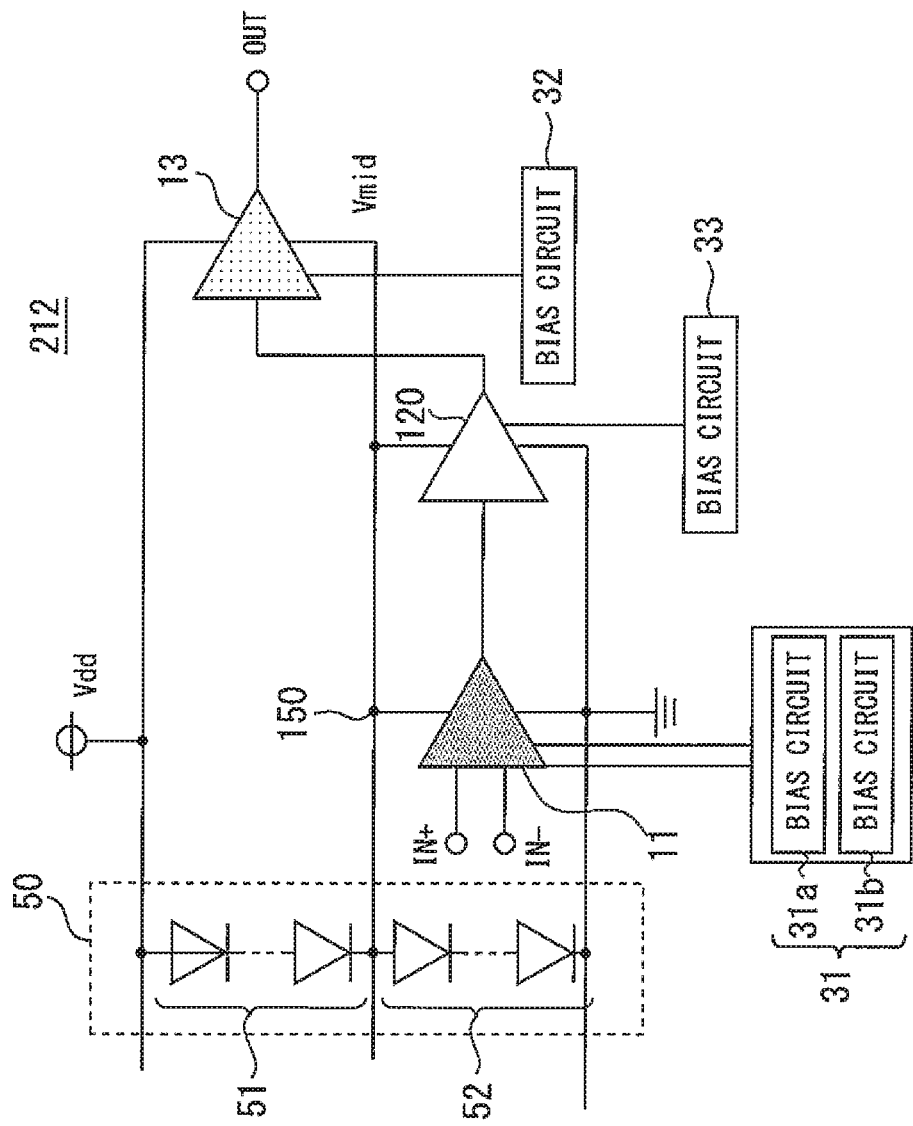

FIGS. 24 and 25 are diagrams showing modified examples (multistage amplifiers 211 and 212) of the multistage amplifier 210 according to the third embodiment of the present invention. In each modified example, the second stage amplifier 120 and the bias circuit 33 are added and three-stage amplification is performed. Referring to FIG. 24, the number of stages in which components are stacked is three, as in the case shown in FIG. 21. Referring to FIG. 25, the number of stages in which components are stacked is two, as in the case shown in FIG. 22. The multistage amplifier 211 in FIG. 24 has an adjustment circuit 53 having diode series circuits 54, 55, and 56 stacked in three stages.

Fourth Embodiment

Figure 26:
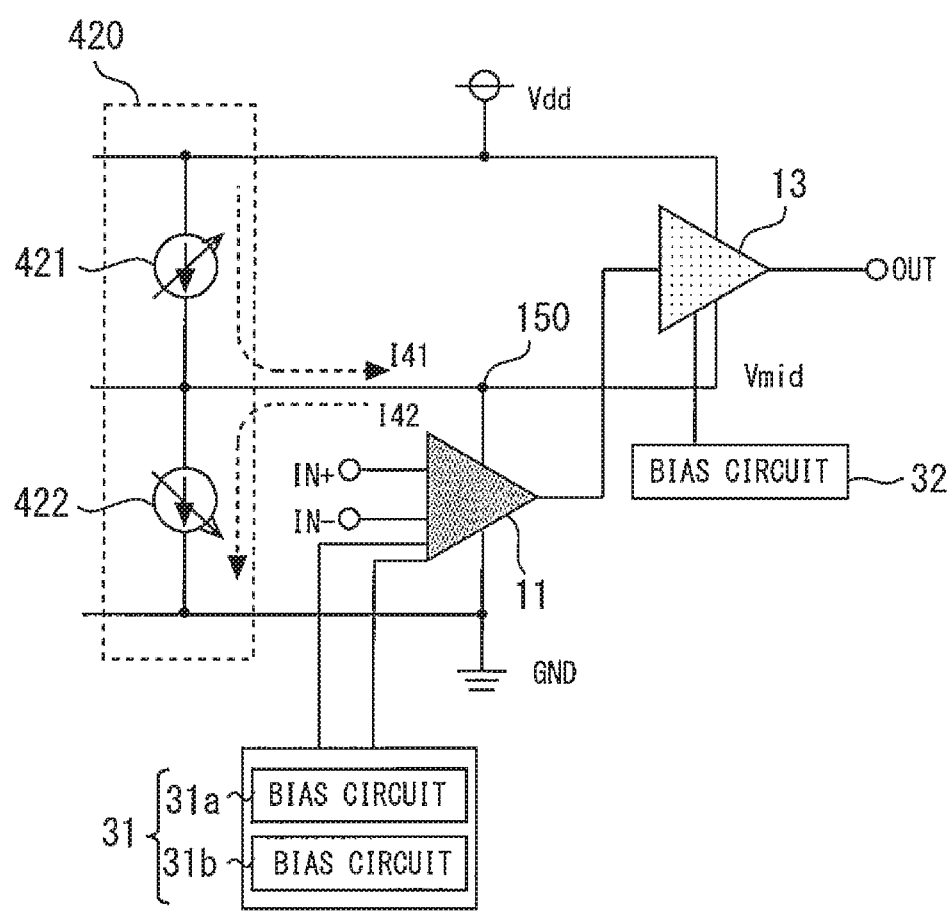
FIG. 26 is a circuit diagram of a multistage amplifier according to a fourth embodiment of the present invention.

FIG. 26 is a circuit diagram of a multistage amplifier 310 according to a fourth embodiment of the present invention. The multistage amplifier 310 according to the fourth embodiment is formed by replacing the adjustment circuit 130 with an adjustment circuit 420. In other respects, the configuration of the amplifier provided in the fourth embodiment is the same as that of the multistage amplifier 110 according to the second embodiment described above. Various modifications described above with respect to the first embodiment can also be made in the fourth embodiment. Also in the fourth embodiment, biases are adjusted with the bias circuit 31 so as to compensate for a reduction in gain due to a rise in temperature. The multistage amplifier having a reduced power consumption and good characteristics can therefore be obtained, as in the case of the first embodiment.

The adjustment circuit 420 performs a preferable circuit operation to adjust the amount of current flowing through the intermediate node 150 so that variation in potential on the intermediate node 150 is limited, as do the second stage amplifier 12 in the first embodiment, the adjustment circuit 130 in the second embodiment, and the adjustment circuit 50 in the third embodiment. The fourth embodiment, however, differs from the first to third embodiments in the following respect. In the first to third embodiments, addition and drawing-off of a current at the intermediate node 150 are performed in a feedback manner on the basis of the potential on the point of connection to the intermediate node 150. In the fourth embodiment, the adjustment circuit 420 is added which performs a current addition/current drawing-off operation reverse to the operation of the bias circuit 31 in opposition to the bias circuit 31 changing the bias with reference to the circuit temperature.

As shown in FIG. 26, the adjustment circuit 420 includes a vertically stacked circuit having a first current source 421 provided in an upper stage and a second current source 422 provided in a lower stage. A connection point between the first current source 421 and the second current source 422 is electrically connected to the intermediate node 150.

Figure 27:
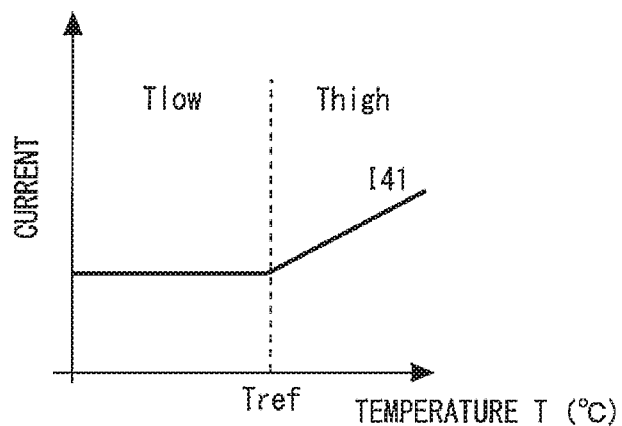
FIGS. 27 and 28 are diagrams showing output-temperature characteristics of the first and second current sources that the multistage amplifier according to the fourth embodiment of the present invention has.
Figure 28:
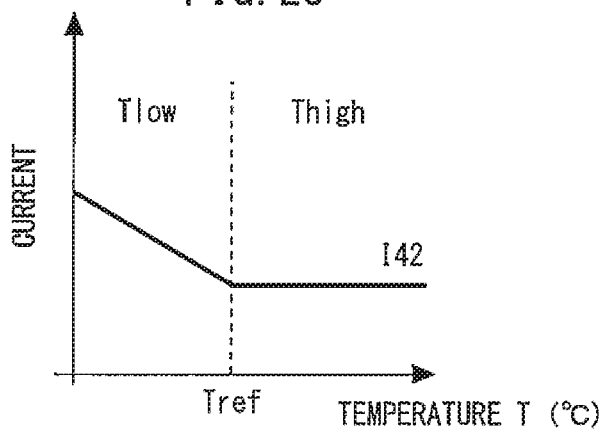

FIGS. 27 and 28 are diagrams showing output-temperature characteristics of the first and second current sources 421 and 422 that the multistage amplifier 310 according to the fourth embodiment of the present invention has. The first current source 421 outputs a current to the intermediate node 150. As shown in FIG. 27, the first current source 421 increases the current flowing into the intermediate node 150 if the circuit temperature is increased when the circuit temperature is equal to or higher than the predetermined reference temperature Tref. The first current source 421 thereby adds the current at the intermediate node 150.

On the other hand, the second current source 422 is electrically connected to the intermediate node 150 and draws off a current from the intermediate node 150. As shown in FIG. 28, the second current source 422 increases the output current value if the circuit temperature lowers when the circuit temperature is lower than the reference temperature Tref. The second current source 422 thereby draws off the current from the intermediate node 150 while increasing the current if the circuit temperature lowers.

Figure 29:
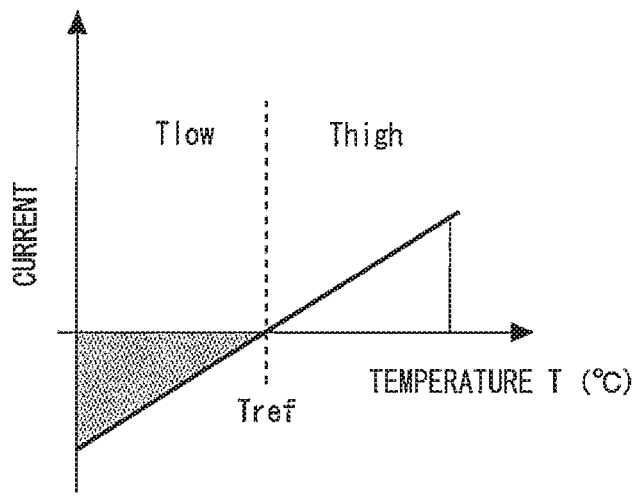
FIG. 29 is a diagram for explaining the operation of the multistage amplifier according to the fourth embodiment of the present invention.

FIG. 29 is a diagram for explaining the operation of the multistage amplifier 310 according to the fourth embodiment of the present invention. In the case where the operation of the first current source 421 and the operation of the second current source 422 are combined, the first current source 421 adds a larger current on the higher temperature side of the reference temperature Tref, so that a deficiency of current in the initial stage amplifier 11 can be limited. Also, the second current source 422 draws off a larger current on the lower temperature side of the reference temperature Tref, so that a surplus current is enabled to escape to the GND node. As a result, the magnitude of the current flowing through the intermediate node 150 can tend to increase monotonously with increase in temperature through both the first temperature region Thigh and the second temperature region Tlow, as shown in the graph of FIG. 29.

The provision of the two current sources having different characteristics on the high temperature side and the low temperature side for the adjustment circuit 420 also ensures the following advantage. In the high temperature region as defined about the reference temperature Tref indicated in FIG. 29, a current is produced from the power supply node Vdd and supplied to the intermediate node 150. In this region, therefore, the entire consumption current is increased. On the other hand, in the low temperature region, the second current source 422 only causes a surplus current to flow to the GND node, with the first current source 421 not operated. Since the first current source 421 is not operated, the consumption current as a whole is constant. As described above, the current flowing through the intermediate node 150 is increased only in the high temperature region side relative to the reference temperature Tref when the potential on the intermediate node 150 is adjusted, thus enabling current saving in the low temperature region side.

Figure 30:
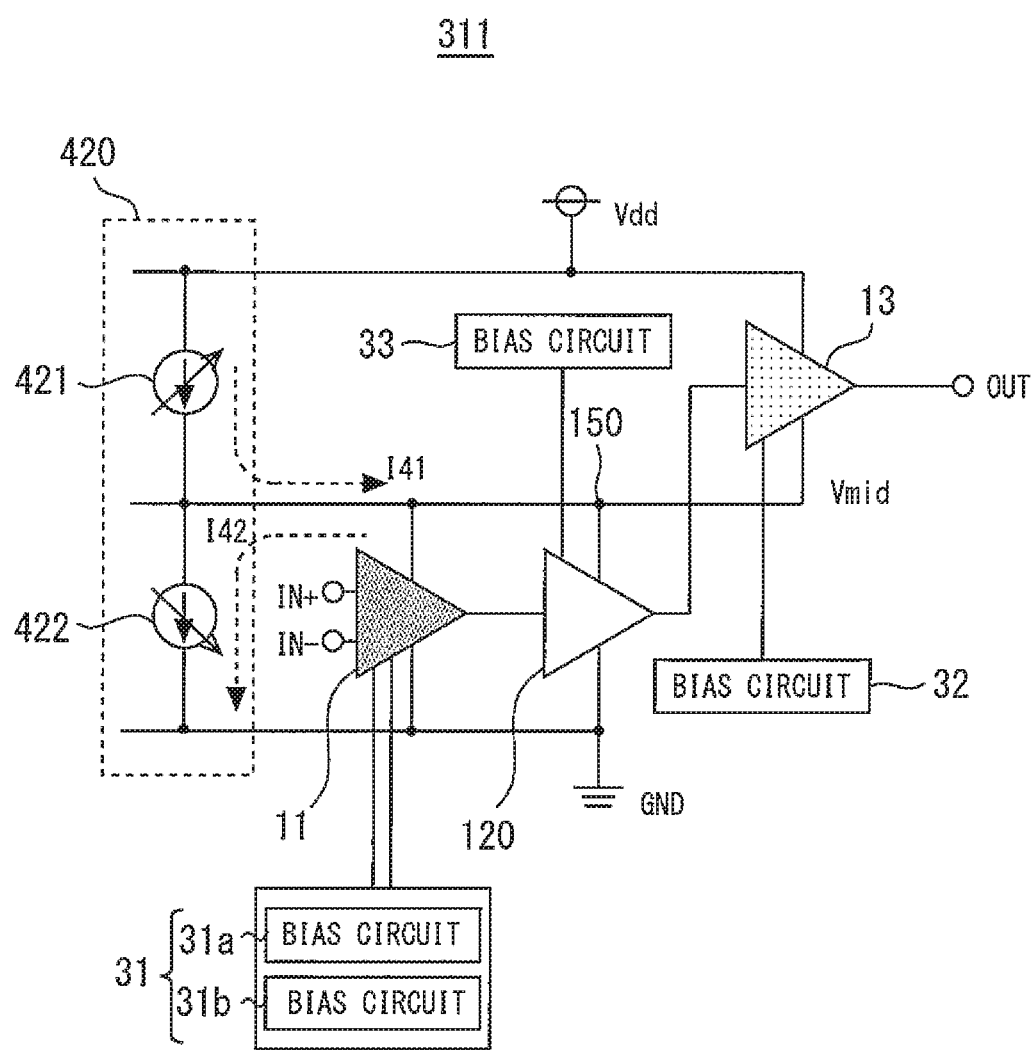
FIGS. 30 to 32 are diagrams showing modified examples of the multistage amplifier according to the fourth embodiment of the present invention.
Figure 31:
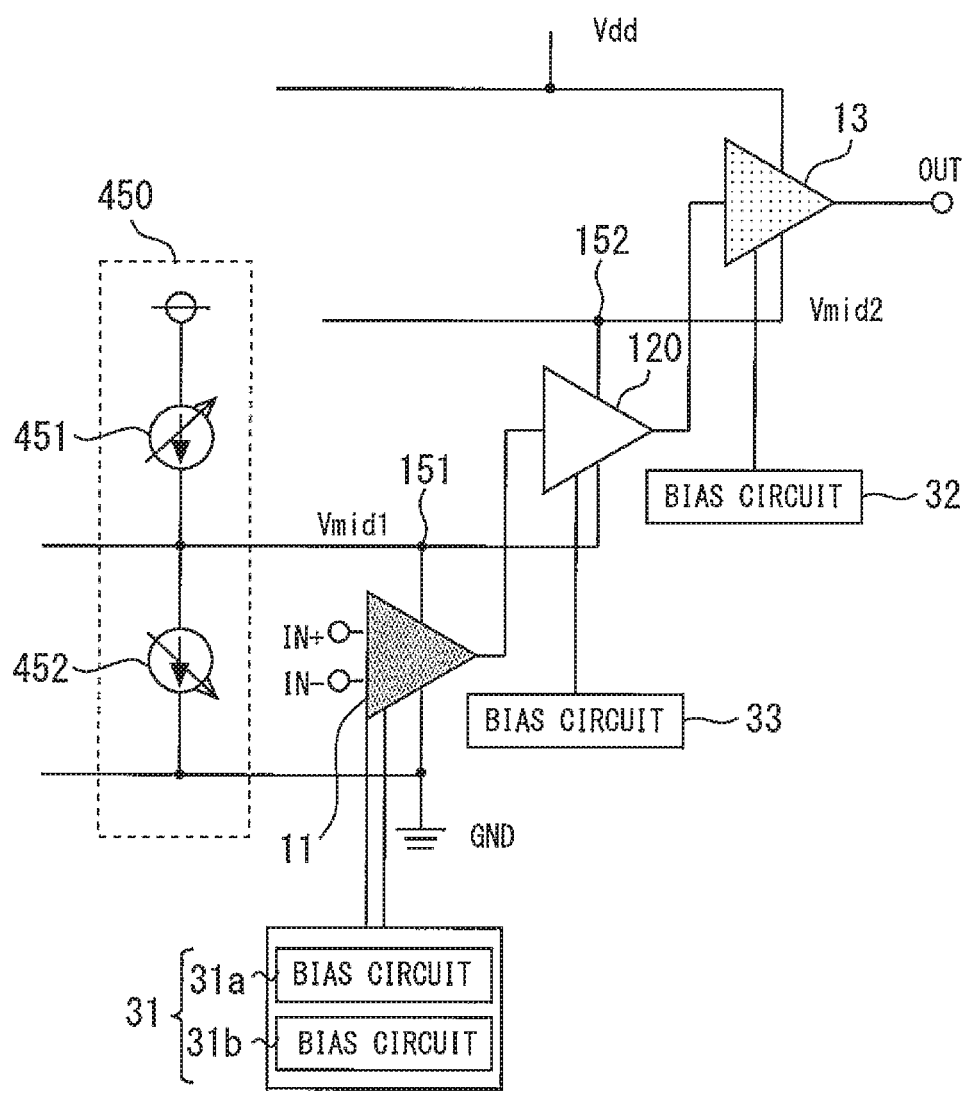

FIGS. 30 and 31 are diagrams showing modified examples of the multistage amplifier 310 according to the fourth embodiment of the present invention. Each of a multistage amplifier 311 shown in FIG. 30 and a multistage amplifier 312 shown in FIG. 31 has the second stage amplifier 120 and the bias circuit 33 added thereto and performs three-stage amplification. Referring to FIG. 30, the number of stages in which components are stacked is two, as in the case shown in FIG. 22. Referring to FIG. 31, the number of stages in which components are stacked is three, as in the case shown in FIG. 21. An adjustment circuit 450 provided in the arrangement shown in FIG. 31 has current sources 451 and 452 vertically stacked in two stages. The current source 451 may have the same temperature characteristic as that of the current source 421 described above with reference to FIG. 26, and the current resource 452 may have the same temperature characteristic as that of the current source 422 described with reference to FIG. 26. The characteristics may be determined so that the amounts of current added and the amounts of current drawn off at the intermediate nodes 151 and 152 are changed in such directions as to limit variations in intermediate node potentials Vmid1 and Vmid2.

As described above with respect to the first embodiment, the bias circuit 32 may have characteristic A (FIG. 10) or characteristic C (FIG. 12) as its output characteristic, and the bias circuit 31 may have one of characteristics B to D (FIG. 11, FIG. 13, FIG. 14) as its output characteristic. A combination of "characteristic A" and "one of characteristics B, D, and E" or a combination of "characteristic C" and "one of characteristics B, D, and E" is possible. Modifications of the adjustment circuit 420 accompanying modifications of the bias circuit 31 and the bias circuit 32 will be described below.

In a case where a combination of characteristic A and characteristic D is provided, the operation on the higher temperature side of the reference temperature Tref is the same as that in the fourth embodiment described above. In the operation on the lower temperature side of the reference temperature Tref, current drawing-off accompanying a change in temperature is unnecessary because each of the biases from the bias circuits 31 and 32 is constant. Accordingly, current addition with the current source 421 may be performed only in the first temperature region Thigh on the higher temperature side of the reference temperature Tref, and the current source 422 may be removed from the adjustment circuit 420.

Figure 32:
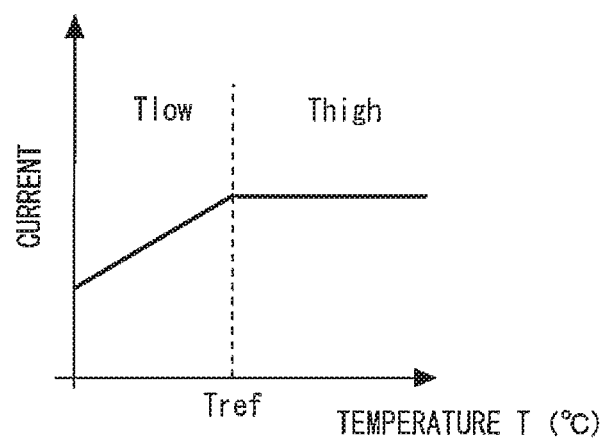

In a case where a combination of characteristic A and characteristic E is provided, the operation in the first temperature region Thigh on the higher temperature side of the reference temperature Tref is the same as that in the fourth embodiment described above. On the other hand, the operation in the second temperature region Tlow on the lower temperature side of the reference temperature Tref differs from that in the fourth embodiment. That is, the bias circuit 31 operates with characteristic E and should therefore cause a larger current to flow from the intermediate node 150 into the initial stage amplifier 11 when the temperature lowers, while the bias circuit 32 constantly maintains the bias. In the case where the combination of characteristic A and characteristic E is provided, therefore, a current which becomes more insufficient with reduction in temperature relative to the reference temperature Tref is increased in the second temperature region Tlow. For example, the current source 422 may have a characteristic shown in FIG. 32 instead of the characteristic shown in FIG. 28. If the current source 422 has such a characteristic, it limits drawing-off of a current when the temperature lowers in the second temperature region Tlow, thereby enabling providing a current in surplus at the intermediate node 150 and supplying the surplus current to the initial stage amplifier 11.

In a case where a combination of characteristic C and characteristic B is provided, the operation in the higher temperature side of the reference temperature Tref is the same as that in the fourth embodiment described above. On the other hand, the operation in the lower temperature side of the reference temperature Tref is such that when the temperature lowers, the bias circuit 32 increases the bias and the bias circuit 31 reduces the bias with reduction in temperature. Due to this, a surplus current at the intermediate node 150 is increased in comparison with the fourth embodiment. It is preferable to use the current source 422 with a higher set current change rate (steeper gradient) in comparison with the characteristic shown in FIG. 28 in order to cause such a surplus current to flow to the GND node.

In a case where a combination of characteristic C and characteristic D is provided, the circuit shown in FIG. 26 can be used. In the case where a combination of characteristic C and characteristic D is provided, the operation in the higher temperature side of the reference temperature Tref is the same as that in the fourth embodiment described above. The operation in the lower temperature side of the reference temperature Tref is such that when the circuit temperature lowers, the bias to the final stage amplifier 13 is increased and the amount of current to be caused to flow into the intermediate node 150 is increased. On the other hand, the current to be supplied from the intermediate node 150 to the initial stage amplifier 11 (more specifically, the drain-source current of the initial stage amplifying transistors Tr1 and Tr2) is constant since the bias to the initial stage amplifier 11 is constant on the lower temperature side of the reference temperature Tref. Therefore, the amount of surplus current at the intermediate node 150 is increased when the temperature is reduced. This surplus current may be caused to flow to the GND node through the current source 422. This operation is the same as the operation of the circuit shown in FIG. 26.

In a case where a combination of characteristic C and characteristic E is provided, the operation in the higher temperature side of the reference temperature Tref is the same as that in the fourth embodiment described above. The operation in the lower temperature side of the reference temperature Tref is such that both the biases to the initial stage amplifier 11 and to the final stage amplifier 13 are increased similarly to each other when the circuit temperature lowers. As a result, both the current to be caused to flow into the intermediate node 150 and the current to be drawn off from the intermediate node 150 are increased and the intermediate node 150 becomes stable. Therefore, the operation of the adjustment circuit 420 is not required on the lower temperature side; the current source 422 may be removed from the adjustment circuit 420.

Obviously many modifications and variations of the present invention are possible in the light of the above teachings. It is therefore to be understood that within the scope of the appended claims the invention may be practiced otherwise than as specifically described.

The entire disclosure of Japanese Patent Application No. 2015-109040, filed on May 28, 2015 including specification, claims, drawings and summary, on which the Convention priority of the present application is based, is incorporated herein by reference in its entirety.

What is claimed is:

1. A multistage amplifier comprising:
   a first transistor having a first terminal to which an input signal is input and a second terminal from which a signal obtained by amplifying the input signal is output;
   a second transistor having a third terminal to which the signal amplified by the first transistor is input, a fourth terminal from which a signal obtained by amplifying the signal received by the third terminal is output and a fifth terminal electrically connected to the second terminal of the first transistor during amplification performed by the first transistor;
   a first bias circuit electrically connected to the first terminal of the first transistor and supplying a first bias to the first terminal so that a magnitude of the first bias is increased with a rise in circuit temperature; and
   a second bias circuit electrically connected to the third terminal of the second transistor and supplying a second bias to the third terminal so that the magnitude of the second bias is constantly maintained with respect to changes in the circuit temperature, wherein
   the second terminal and the fifth terminal are electrically connected to an intermediate node, and the multistage amplifier further comprises an adjustment circuit to change an amount of a current flowing through the intermediate node so that a current flowing in the second terminal of the first transistor differs from a current flowing through the fourth terminal and the fifth terminal of the second transistor.

2. The multistage amplifier according to claim 1, wherein a variation in potential on the intermediate node is limited.

3. The multistage amplifier according to claim 2, wherein the adjustment circuit performs addition or drawing-off of a current at the intermediate node on the basis of a potential on a connection point at which the intermediate node and the adjustment circuit are electrically connected to each other.

4. The multistage amplifier according to claim 3, wherein the adjustment circuit includes a self-biased CMOS inverter having an input terminal electrically connected to the second terminal of the first transistor and an output terminal electrically connected to the third terminal of the second transistor, the self-biased CMOS inverter amplifying a signal input to the input terminal and outputting the amplified signal through the output terminal.

5. The multistage amplifier according to claim 2, wherein the adjustment circuit includes:
   a current adding circuit which, when the potential on the intermediate node is equal to or lower than a predetermined value, increases a current added at the intermediate node if the potential on the intermediate node is reduced; and
   a current drawing-off circuit which, when the potential on the intermediate node exceeds the predetermined value, increases a current drawn off from the intermediate node if the potential on the intermediate node is increased.

6. The multistage amplifier according to claim 5, wherein the current adding circuit includes:

a third transistor having a first drain, a first gate and a first source to be electrically connected to a power supply potential; and a first operational amplifier having a positive input electrically connected to the intermediate node and a negative input to which a predetermined reference voltage is applied, the first operational amplifier applying an output to the first gate, wherein the current drawing-off circuit includes:

a fourth transistor having a second drain electrically connected to the first drain, a second source to be electrically connected to a reference potential, a second gate, and a connection point between the first drain and the second drain being electrically connected to the intermediate node; and a second operational amplifier having a positive input electrically connected to the intermediate node and a negative input to which the reference voltage is applied, the second operational amplifier applying an output to the second gate.

7. The multistage amplifier according to claim 5, wherein the first transistor has another terminal electrically connected to a reference potential terminal;

the current drawing-off circuit includes a lower stage diode series circuit formed by electrically connecting a plurality of diodes one to another in a forward direction;

the current adding circuit includes an upper stage diode series circuit formed by electrically connecting a plurality of diodes one to another in a forward direction;

a connection point between an anode end of the lower stage diode series circuit and a cathode end of the upper stage diode series circuit is electrically connected to the intermediate node;

a cathode end of the lower stage diode series circuit is electrically connected to the another terminal of the first transistor; and an anode end of the upper stage diode series circuit is electrically connected to the fourth terminal of the second transistor.

8. The multistage amplifier according to claim 1, wherein the first bias circuit increases the first bias if the circuit temperature rises in a first temperature region of temperature equal to or higher than a predetermined reference temperature, and constantly maintains the magnitude of the first bias with respect to the circuit temperature in a second temperature region of temperature below the reference temperature or increases the first bias if the circuit temperature lowers in the second temperature region, and the second bias circuit constantly maintains the magnitude of the second bias through the first temperature region and the second temperature region.

9. The multistage amplifier according to claim 1, wherein the second bias circuit constantly maintains the magnitude of the second bias with respect to the circuit temperature in a first temperature region of temperature equal to or higher than a predetermined reference temperature, and increases the second bias if the circuit temperature lowers in a second temperature region of temperature below the reference temperature, and the first bias circuit increases the magnitude of the first bias if the circuit temperature becomes higher in the first temperature region, and changes the first bias in the second temperature region with one of a first tendency to reduce the magnitude of the first bias if the circuit temperature becomes lower, a second tendency to constantly maintain the magnitude of the first bias with respect to the circuit temperature, and a third tendency to increase the magnitude of the first bias if the circuit temperature becomes lower.

10. The multistage amplifier according to claim 2, wherein the adjustment circuit includes a current source electrically connected to the intermediate node, and the current source changes an output current so that the current flowing into the intermediate node is increased if the circuit temperature rises.

11. The multistage amplifier according to claim 10, wherein the current source includes:

a first current source which outputs a current to the intermediate node and increases the current flowing into the intermediate node if the circuit temperature becomes higher when the circuit temperature is equal to or higher than a predetermined reference temperature; and a second current source which is electrically connected to the intermediate node, and which draws off a current from the intermediate node by increasing an output current value if the circuit temperature becomes higher when the circuit temperature is lower than the reference temperature.

* * * * *